United States Patent
Nakajima et al.

(10) Patent No.: US 7,129,522 B2
(45) Date of Patent: Oct. 31, 2006

(54) SEMICONDUCTOR DEVICE AND ITS MANUFACTURING METHOD

(75) Inventors: Setsuo Nakajima, Kanagawa (JP); Ritsuko Kawasaki, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 153 days.

(21) Appl. No.: 10/737,909

(22) Filed: Dec. 18, 2003

(65) Prior Publication Data
US 2004/0124419 A1 Jul. 1, 2004

Related U.S. Application Data

(62) Division of application No. 09/768,618, filed on Jan. 25, 2001, now Pat. No. 6,780,687.

(30) Foreign Application Priority Data
Jan. 28, 2000 (JP) ............................. 2000-020913

(51) Int. Cl.
*H01L 29/04* (2006.01)
*H01L 29/10* (2006.01)
*H01L 31/036* (2006.01)
(52) U.S. Cl. ............................ 257/59; 257/69; 257/72; 257/64; 257/70; 257/E21.133; 257/E29.293; 257/E21.703
(58) Field of Classification Search ............ 257/57–74, 257/255, 267, E21.133, E21.134, E21.703, 257/627; 438/149–166
See application file for complete search history.

(56) References Cited

U.S. PATENT DOCUMENTS

| 4,330,363 | A | | 5/1982 | Biegesen et al. |
|---|---|---|---|---|
| 4,466,179 | A | | 8/1984 | Kasten |
| 4,984,033 | A | | 1/1991 | Ishizu et al. |
| 5,130,829 | A | * | 7/1992 | Shannon ...................... 349/111 |
| 5,145,808 | A | | 9/1992 | Sameshima et al. |
| 5,194,853 | A | | 3/1993 | Asada |
| 5,233,211 | A | | 8/1993 | Hayashi et al. |
| 5,247,375 | A | | 9/1993 | Mochizuki et al. |

(Continued)

FOREIGN PATENT DOCUMENTS

JP        07-130652        5/1995

OTHER PUBLICATIONS

Bonnel et al., "Polycrystalline Silicon Thin-Film Transistors with Two-Step Annealing Process," *IEEE Electron Device Letters*, 1993, 14(12):551-553.

(Continued)

*Primary Examiner*—B. William Baumeister
*Assistant Examiner*—Igwe U. Anya
(74) *Attorney, Agent, or Firm*—Fish & Richardson P.C.

(57) ABSTRACT

Protrusions called ridges are formed on the surface of a crystalline semiconductor film formed by a laser crystallization method or the like. A heat absorbing layer are formed below a semiconductor film. When the semiconductor film is crystallized by laser, a temperature difference is produced between a semiconductor film 1010 positioned above a heat absorbing layer 1011 and a semiconductor film 1013 of the other region to produce a difference in thermal expansion at the boundary of the outside end 1015 of the heat absorbing layer. This difference produces a strain to form a surface wave. The surface wave starting at the outer periphery of the heat absorbing layer is formed in the vicinity of the heat absorbing layer. When the semiconductor layer is solidified after it is melted, the protrusions of the surface wave remain as protrusions after the semiconductor film is solidified.

38 Claims, 21 Drawing Sheets

U.S. PATENT DOCUMENTS

| | | | | |
|---|---|---|---|---|
| 5,264,383 | A | 11/1993 | Young | |
| 5,365,875 | A | 11/1994 | Asai et al. | |
| 5,372,836 | A | 12/1994 | Imahashi et al. | |
| 5,403,762 | A | 4/1995 | Takemura | |
| 5,403,772 | A | 4/1995 | Zhang et al. | |
| 5,413,958 | A | 5/1995 | Imahashi et al. | |
| 5,414,442 | A | 5/1995 | Yamazaki et al. | |
| 5,432,122 | A | 7/1995 | Chae | |
| 5,449,637 | A | 9/1995 | Saito et al. | |
| 5,453,858 | A | 9/1995 | Yamazaki | |
| 5,477,073 | A | 12/1995 | Wakai et al. | |
| 5,514,879 | A | 5/1996 | Yamazaki | |
| 5,529,630 | A | 6/1996 | Imahashi et al. | |
| 5,563,426 | A | 10/1996 | Zhang et al. | |
| 5,570,105 | A | 10/1996 | Koyama | |
| 5,572,045 | A | 11/1996 | Takahashi et al. | |
| 5,589,406 | A | 12/1996 | Kato et al. | |
| 5,614,426 | A * | 3/1997 | Funada et al. | 438/150 |
| 5,614,732 | A | 3/1997 | Yamazaki | |
| 5,627,084 | A | 5/1997 | Yamazaki et al. | |
| 5,680,147 | A | 10/1997 | Yamazaki et al. | |
| 5,696,003 | A * | 12/1997 | Makita et al. | 438/166 |
| 5,701,167 | A | 12/1997 | Yamazaki | |
| 5,708,252 | A | 1/1998 | Shinohara et al. | |
| 5,763,904 | A * | 6/1998 | Nakajima et al. | 257/66 |
| 5,767,930 | A | 6/1998 | Kobayashi et al. | |
| 5,776,803 | A * | 7/1998 | Young | 438/149 |
| 5,818,076 | A * | 10/1998 | Zhang et al. | 257/255 |
| 5,849,601 | A | 12/1998 | Yamazaki | |
| 5,851,862 | A * | 12/1998 | Ohtani et al. | 438/166 |
| 5,859,445 | A | 1/1999 | Yamazaki | |
| 5,882,960 | A * | 3/1999 | Zhang et al. | 438/166 |
| 5,894,137 | A * | 4/1999 | Yamazaki et al. | 257/66 |
| 5,895,933 | A * | 4/1999 | Zhang et al. | 257/49 |
| 5,932,893 | A * | 8/1999 | Miyanaga et al. | 257/66 |
| 5,937,304 | A | 8/1999 | Yoshinouch et al. | |
| 5,939,731 | A | 8/1999 | Yamazaki et al. | |
| 5,943,593 | A | 8/1999 | Noguchi et al. | |
| 5,970,368 | A | 10/1999 | Sasaki et al. | |
| 6,011,277 | A | 1/2000 | Yamazaki | |
| 6,023,075 | A | 2/2000 | Yamazaki | |
| 6,025,217 | A * | 2/2000 | Kanaya et al. | 438/166 |
| 6,025,218 | A * | 2/2000 | Brotherton | 438/166 |
| 6,043,512 | A * | 3/2000 | Adachi | 257/66 |
| 6,051,453 | A * | 4/2000 | Takemura | 438/166 |
| 6,090,646 | A * | 7/2000 | Zhang et al. | 438/150 |
| 6,096,581 | A | 8/2000 | Zhang et al. | |
| 6,133,583 | A | 10/2000 | Ohtani et al. | |
| 6,190,949 | B1 | 2/2001 | Noguchi et al. | |
| 6,274,888 | B1 * | 8/2001 | Suzuki et al. | 257/72 |
| 6,281,552 | B1 | 8/2001 | Kawasaki et al. | |
| 6,440,824 | B1 | 8/2002 | Hayashi et al. | |
| 6,452,213 | B1 * | 9/2002 | Kimura et al. | 257/66 |
| 6,479,837 | B1 * | 11/2002 | Ogawa et al. | 257/59 |
| 6,506,669 | B1 | 1/2003 | Kuramasu et al. | |
| 6,528,822 | B1 | 3/2003 | Murade | |
| 6,582,996 | B1 * | 6/2003 | Hara et al. | 438/166 |
| 6,608,325 | B1 * | 8/2003 | Zhang et al. | 257/64 |
| 6,653,657 | B1 * | 11/2003 | Kawasaki et al. | 257/69 |
| 6,674,136 | B1 * | 1/2004 | Ohtani | 257/408 |
| 2002/0098635 | A1 | 7/2002 | Zhang et al. | |
| 2002/0105033 | A1 | 8/2002 | Zhang | |

OTHER PUBLICATIONS

Fujieda et al., "Self-referenced Poly-Si TFT Amplifier Readout for a linear Image Sensor," *IEEE*, 1993, pp. 587-590.

Fuse et al., "Performance of Poly-Si Thin Film Transistors Fabricated by Excimer-Laser Annealing of $SiH_4$- and $Si_2H_6$- Source Low Pressure Vapor Deposited a-Si Films with or without Solid-Phase Crystallization," *Solid State Phenomena*, 1994, vols. 37-38, pp. 565-570.

* cited by examiner

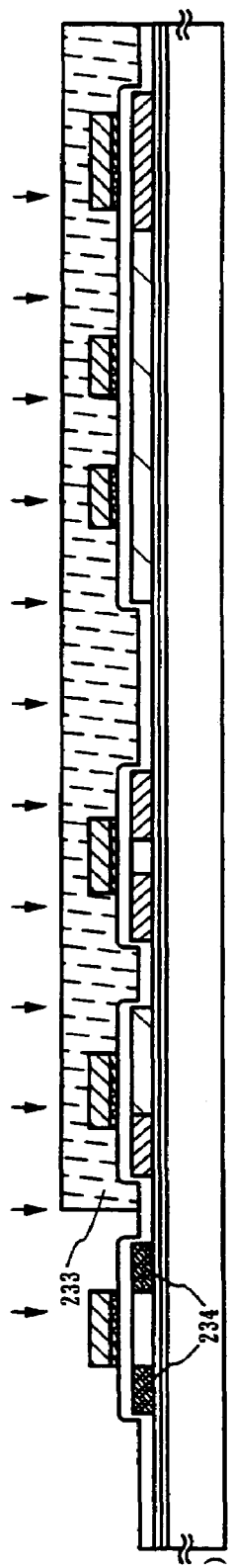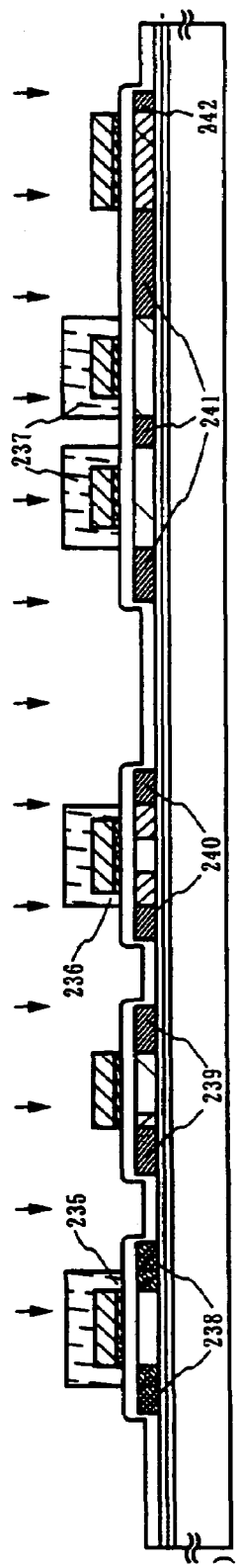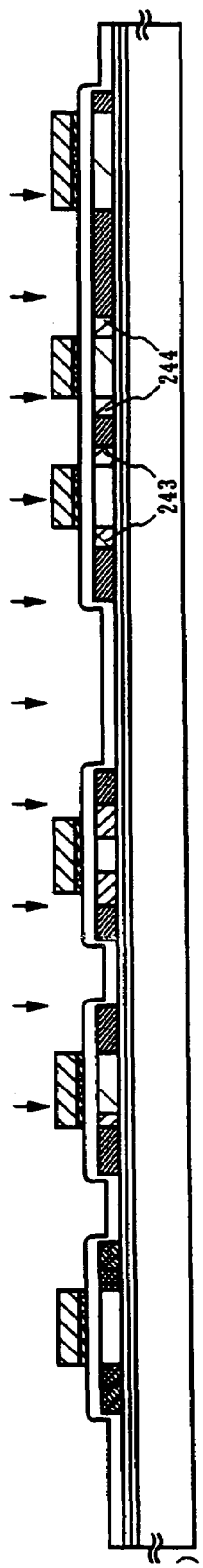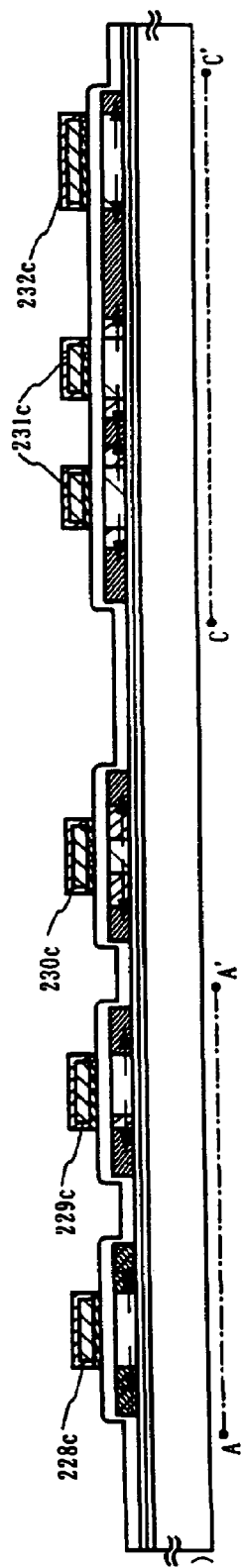

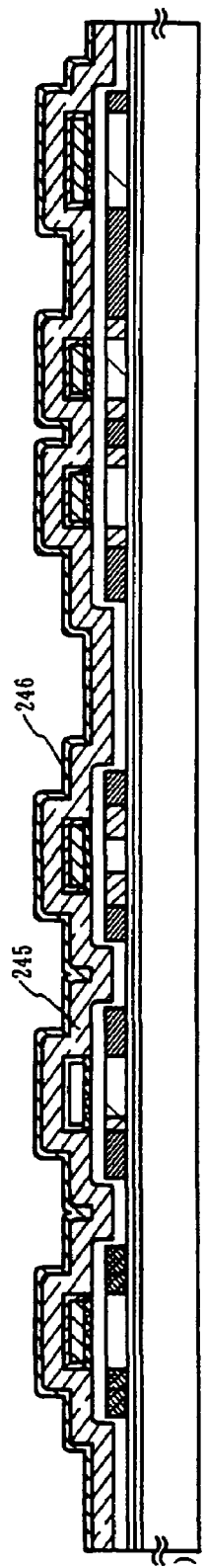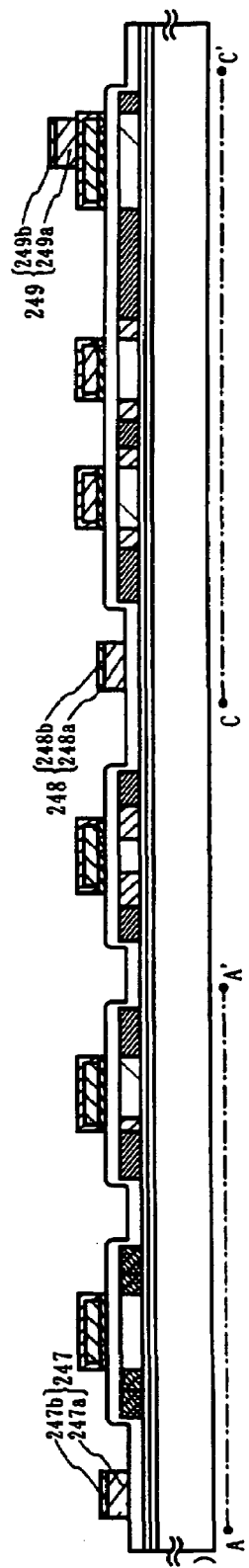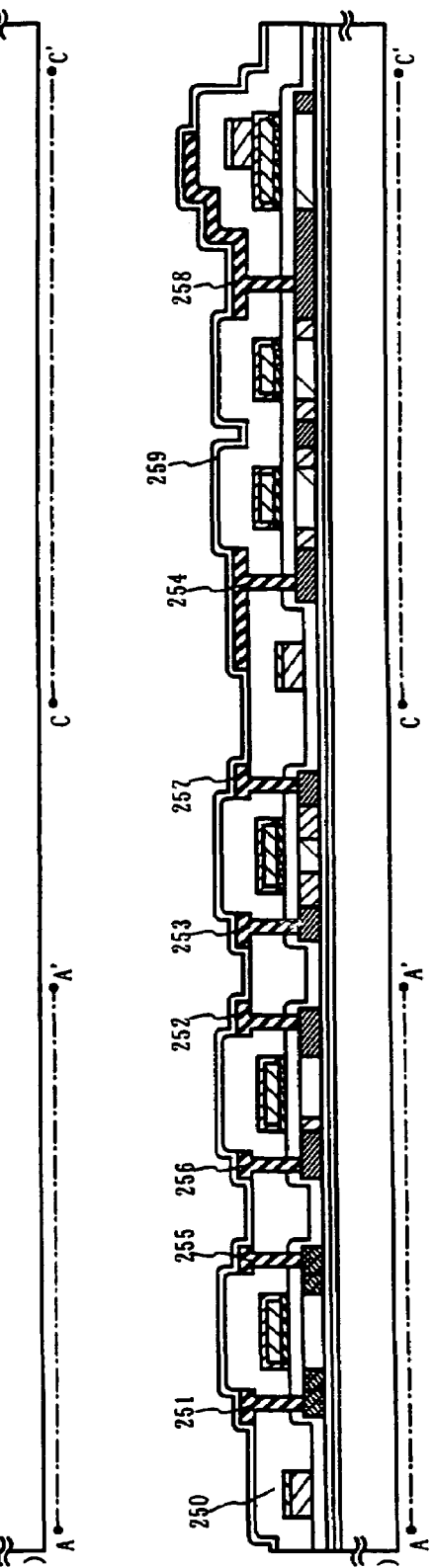

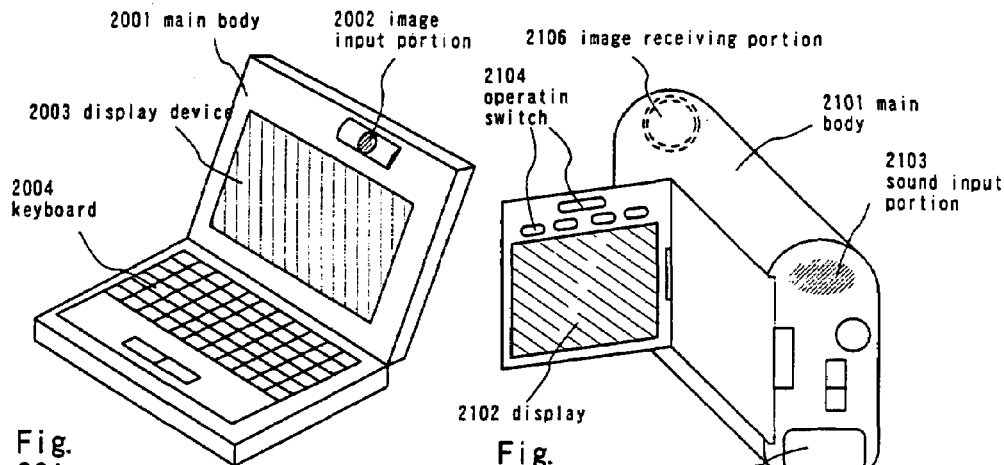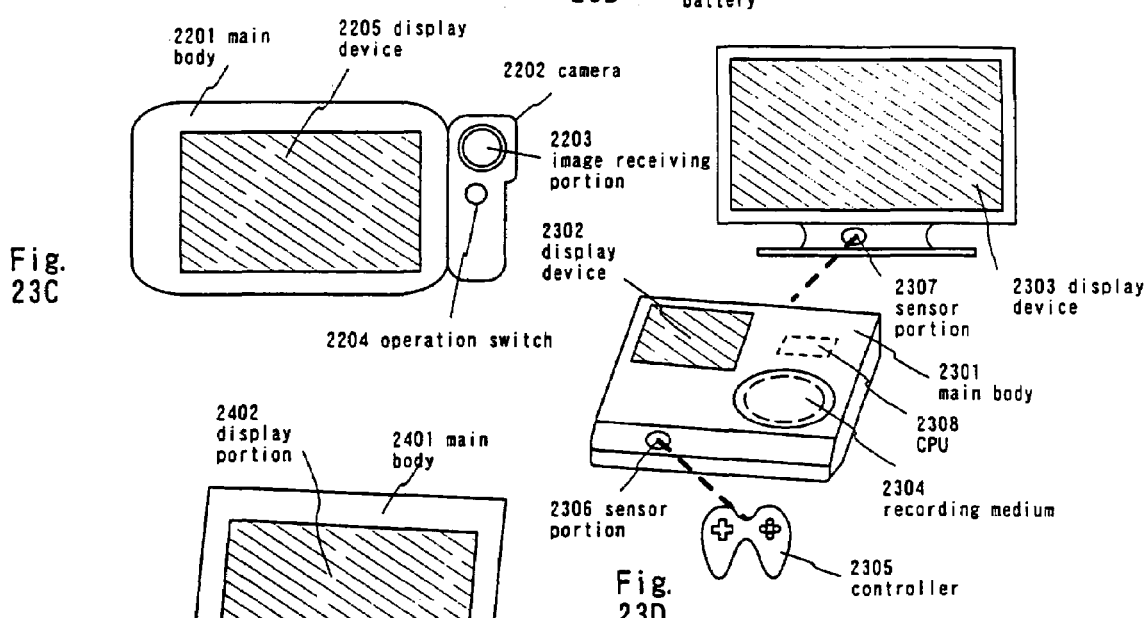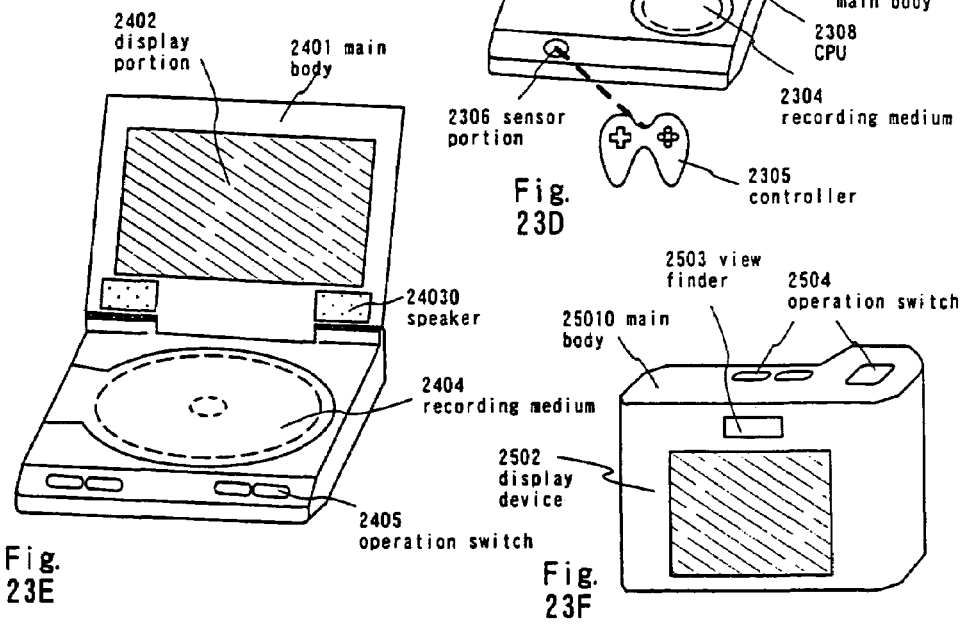

SEMICONDUCTOR DEVICE AND ITS MANUFACTURING METHOD

CROSS-REFERENCE TO RELATED APPLICATIONS

This application is a divisional application of U.S. application Ser. No. 09/768,618, filed on Jan. 25, 2001 now U.S. Pat. No. 6,780,687, which claims the benefit from a foreign priority application filed in Japan on Jan. 28, 2000, as serial number 2000-020913. This application claims priority to all of these applications, and all of these applications are incorporated by reference.

BACKGROUND OF THE INVENTION

1. Field of the Invention

The present invention relates to a semiconductor device using a semiconductor thin film and its manufacturing method and, in particular, to a thin film transistor (hereinafter referred to as TFT) using a crystalline semiconductor thin film containing silicon.

2. Description of the Related Art

In recent years, a technology for forming a TFT on a glass substrate or the like to constitute a semiconductor circuit has been rapidly advanced. As a typical semiconductor device, there is an active matrix type liquid crystal display (hereinafter referred to as AMLCD) integrated with a driver. The AMLCD integrated with a driver is a monolithic display device having a pixel section and a driver circuit on the same substrate. Further, a system-on panel in which a memory circuit, a clock generating circuit, and the like are built has been developed.

While a TFT in which an amorphous silicon (hereinafter referred to as a-Si) is used in an active layer is employed as a switching device of a pixel in a conventional AMLCD, in the peripheral circuit of the AMLCD integrated with a driver is mainly employed a TFT in which a polycrystalline silicon (hereinafter referred to as poly-Si) having a higher field effect mobility is used as the active layer because the a-Si is not suitable for the peripheral circuit which is required to operate at high speeds.

A conventional poly-Si TFT has a higher field effect mobility than an a-Si TFT. When a variety of circuits are mounted on a system-on panel, however, because the circuits are required to operate at higher speeds, the TFTs employed by the circuits are required to have a field effect mobility higher than the AMLCD integrated with a driver.

Also, even in the AMLCD integrated with a driver, TFTs having a higher field effect mobility are required because it is required to operate at high speeds due to an increase in the number of pixels and to reduce the area of a driver circuit.

Chief among factors determining the field effect mobility of the TFT is a surface dispersion effect. The flatness of an interface between the active layer of the TFT and a gate insulating film produces a large effect on the field effect mobility of the TFT, and as the interface becomes flatter, the effect of the surface dispersion becomes less and thus the field effect mobility becomes larger.

One of currently available methods of producing a crystalline silicon film is a laser crystallization method, and a method of applying an excimer laser to an amorphous silicon film to crystallize it has been known. An amorphous silicon film having a thickness of 10 nm to 150 nm (typically 30 nm to 60 nm) is formed on an insulating substrate by sputtering, CVD, or the like and subsequently irradiated with excimer laser light, whereby the amorphous silicon film is melted, solidified, and crystallized. In the case where the amorphous silicon film contains about 5% or more hydrogen, it is previously dehydrogenated by a heat treatment performed at temperatures of about 400° C. to 500° C. for several hours because hydrogen is explosively removed when it is annealed by a laser.

While the conditions of the laser crystallization are selected by an operator, when the excimer laser is employed, for example, a laser pulse oscillation frequency is 30 Hz and a laser energy density is 100 mJ/cm$^3$ to 500 mJ/cm$^3$ (typically, 300 mJ/cm$^3$ to 400 mJ/cm$^3$). A linear laser beam is applied to the whole surface of the substrate, wherein the overlapping ratio of the linear beam is 80% to 98%.

Protrusions (or bumps) called ridges are formed at random on the surface of the film crystallized in this way by the laser beam. It is thought that the protrusions are produced by surface tension waves induced on the surface of Si annealed and melted by the laser. Typically, the protrusions have a thickness two times the thickness of the thin film. The thickness of the thin film is usually 30 nm to 60 nm and thus the protrusions have a height of 30 nm to 60 nm from the surface of the film. The protrusions formed in this way give dispersion to the movements of electrons or holes due to the above-mentioned surface dispersion effect to reduce the field effect mobility of the TFT. The larger the protrusions are, the larger the effects are.

SUMMARY OF THE INVENTION

It is an object of the present invention to provide a technology for controlling the arrangement of the protrusions described above to reduce the effect of a surface dispersion on an electric current.

The present invention produces a crystalline semiconductor thin film by melting and solidifying a non-single crystalline semiconductor film such as amorphous, microcrystalline or polycrystalline semiconductor thin film by the use of strong light such as a laser or the like, and is characterized in that protrusions existing on the surface of the crystalline semiconductor thin film are aligned in parallel to the direction of length of a channel, that is, the direction in which an electric current flows to thereby produce an electric current path which is not affected by the surface dispersion caused by the protrusions.

In FIGS. 1(A) and 1(B) and FIGS. 2(A) and 2(B) are shown the conceptional view of the present invention. FIGS. 1(A) and 1(B) are a schematic view of the surface of a semiconductor thin film produced by crystallizing an amorphous silicon film by a conventional laser crystallization technology, whereas FIGS. 2(A) and 2(B) are a schematic view of the surface of a semiconductor thin film produced by the present invention, the respective figures showing a schematic view of a channel portion of a TFT. In the conventional technology, since protrusions 1001 are formed at random on the surface of a semiconductor thin film 1003 of a substrate 1004, a plurality of protrusions interfere with an electric current path 1002 to reduce mobility by the effects of surface dispersion. In the present invention, since the protrusions 1005 are aligned in parallel to an electric current path 1006, current paths which do not cross the protrusions 1005 are predominant. Such current paths are not affected by the surface dispersion and hence produce high field effect mobility. In other words, the arrangement of the protrusion is such that regions having a larger number of protrusions and regions having no or less number of protrusions appear in turn in a direction orthogonal to the electric current path 1006. The effect of the present invention may be obtained even if this direction is slightly deviated from the ideal direction, for example, within a range of ±30°, preferably ±15°.

Further, also in the case where a crystalline thin film produced by a thermal crystallization technology or the like is melted at least partly and solidified by strong light such as a laser or the like for the purpose of improving its properties, protrusions are produced as is the case where an amorphous film is melted, solidified and crystallized by strong light such as a laser or the like. In this case, the case where the protrusions existing in the crystalline thin film melted, solidified and re-crystallized are aligned in parallel to the direction in which an electric current flows to produce an electric current path not affected by the surface dispersion effect of the protrusions is also included in the present invention. The essential object of the present invention resides in intentionally aligning protrusions, which are produced when a thin film containing silicon is melted and solidified, in an objective direction, and the present invention is not limited by the property or the sort of a starting film.

A mechanism of producing the protrusions produced when a thin film containing silicon is melted and solidified by strong light such as a laser or the like has not yet completely clarified until now. It is considered true as described above, however, that the protrusions are caused by surface waves produced when the thin film is melted. The present inventor has tried controlling the positions of the protrusions by positively controlling the surface waves produced when the thin film is melted and solidified and thus has achieved the present invention. An idea of positively controlling the surface waves produced when the thin film is melted has never been tried and is the one of the features of the present invention.

When a uniform silicon thin film is melted, there is no cause for limiting the shapes of surface waves and hence the surface waves are produced at random, that is, protrusions are produced at random when the thin film is solidified, whereas when the thin film is melted such that the surface waves are aligned in a specific direction, the protrusions are also aligned along the direction in which the surface waves are formed. The present inventor has discovered that the wave front of the surface waves can be aligned in a specific direction by providing a structure of controlling the surface waves produced when the thin film is subjected to laser annealing.

To be more specific, the present inventor has realized the alignment of the wave front of the surface waves by forming a material, which has a thermal conductivity larger than a substrate including an underlying film, as a heat absorbing layer in a predetermined shape before a semiconductor thin film was formed. FIG. 3 is a schematic cross-sectional view of the heat absorbing layer. When a semiconductor thin film is subjected to laser annealing, a temperature difference is produced between a semiconductor thin film 1010 positioned above a heat absorbing layer 1011 formed on a substrate 1014 via an underlying film 1012 and a semiconductor thin film 1013 of the other region to produce a difference in thermal expansion at the boundary of the outside end 1015 of the heat absorbing layer. A difference in volumetric expansion caused by heat produces a strain starting at the boundary. This strain becomes a surface wave and propagates to form a surface wave starting at the outer periphery of the heat absorbing layer in the vicinity of the heat absorbing layer. When the semiconductor layer is solidified after it is melted, the protrusions of the surface wave remain as protrusions after the semiconductor film is solidified.

FIG. 4 is a SEM photograph of the surface of a poly-Si semiconductor thin film formed by using the present invention, and FIG. 5 is a schematic view of the surface of the semiconductor thin film. It can be observed that the protrusions 1022 are aligned like ripples on the semiconductor film 1021 around the semiconductor film 1020 formed on the heat absorbing layer at the center. FIG. 6 shows an AFM observation image in which the protrusions are aligned. FIG. 7 is a schematic view of the AFM observation image, in which a surface state 1051 of a region of 2.5 μm square is shown. As is evident from the figure, protrusions 1054 are aligned and a cross-sectional shape 1058 along a direction 1056 parallel to the line of the protrusions has a surface having a smaller number of protrusions and dips than a cross-sectional shape 1057 along a direction 1055 perpendicular to the line of the protrusions. Here, the height of the cross-sectional shape is shown in a scale of about 90 nm in full range. In the surface state like this, flowing an electric current in the direction parallel to the line of the protrusions can produce an electric current path which is not affected by the surface dispersion and thus can realize a TFT having high mobility.

In a sample in accordance with the present invention, a 0.7 mm thick glass plate (No. 1737 made by Corning Corp.) was used as a substrate and a heat absorbing layer (300 nm) was formed of Ta (tantalum). A 125 nm thick silicon oxide film was formed as an underlying film by a PCVD and thereafter a-Si film having a thickness of 30 nm was formed by the PCVD. Then, the sample was dehydrogenated at 500° C. for 1 hour and is subjected to laser annealing at a room temperature by applying 10 shots of a XeCl excimer laser at a power of 308 mJ/cm$^2$.

BRIEF DESCRIPTION OF THE DRAWINGS

The preferred embodiments of the present invention will be described in detail based on the following figures, in which:

FIGS. 16(A) to 16(D) show a process flow of an active matrix substrate utilizing the present invention;

FIGS. 17(A) to 17(C) show a process flow of an active matrix substrate utilizing the present invention;

FIGS. 23A to 23F show various kinds of devices utilizing the present invention.

DESCRIPTION OF THE PREFERRED EMBODIMENTS

The preferred embodiments of the present invention will be hereinafter described. The constitution of the invention disclosed in this specification is a semiconductor device using a crystalline semiconductor thin film on a substrate having an insulating surface as an active layer. Here, the semiconductor device described above includes not only devices such as a TFT or the like but also units employing the devices, for example, the AMLCD, a display, and electronic apparatuses using these units.

The present invention can be used for providing a TFT of high mobility and if it is applied to a TFT for switching a pixel in the AMLCD, it can reduce the size of the TFT and produce a panel having a high aperture ratio. Also, if it is applied to a peripheral circuit, it can realize a circuit operating at high speeds and make a large size, high definition AMLCD.

In the present preferred embodiment, a method of making a p-channel type TFT and an n-channel type TFT, which are the basic constituent devices of an active matrix substrate for the AMLCD, will be described.

Figure 8:
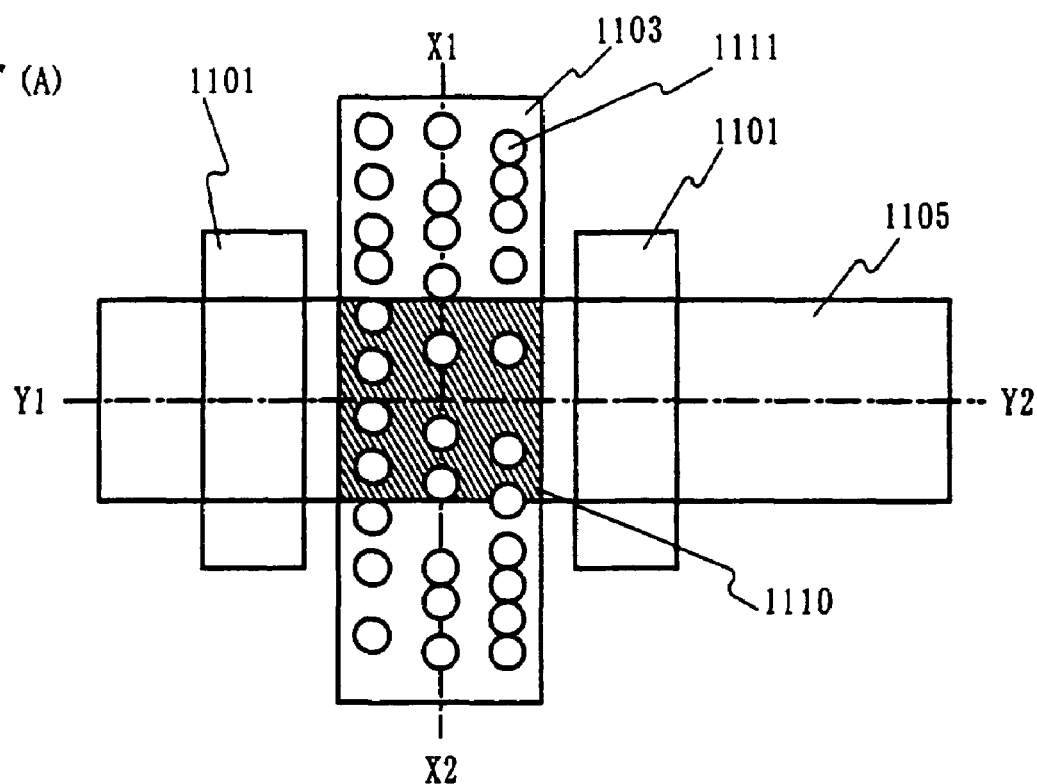
FIGS. 8(A) to 8(C) are schematic views of a TFT utilizing the present invention.
Figure 8:
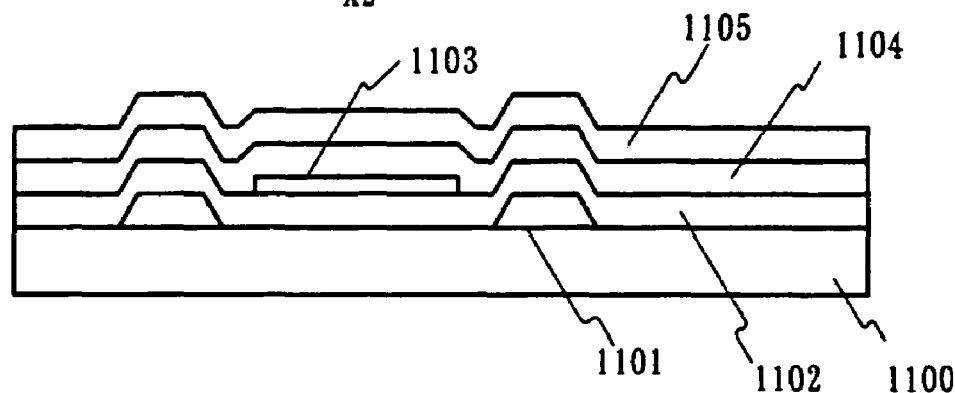
Figure 8:
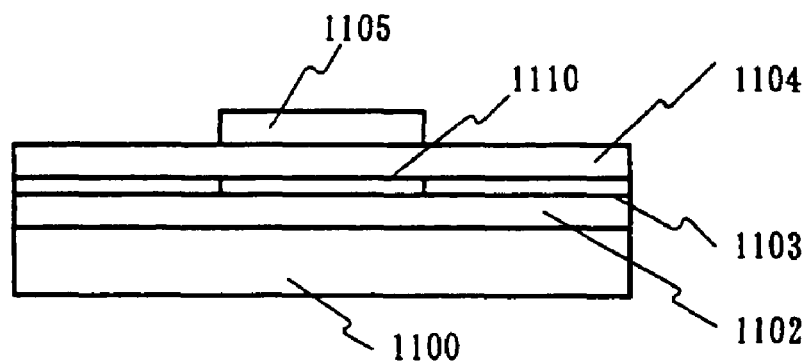
Figure 9A:
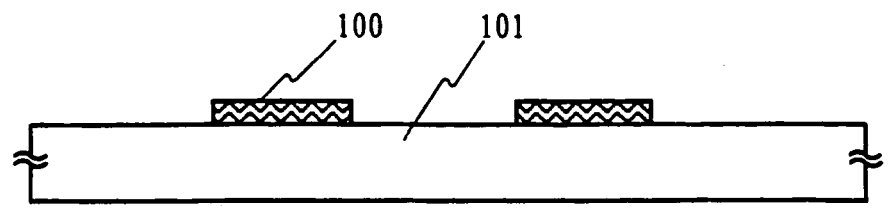
FIGS. 9(A) to 9(D) show a process flow of a TFT utilizing the present invention.
Figure 9B:
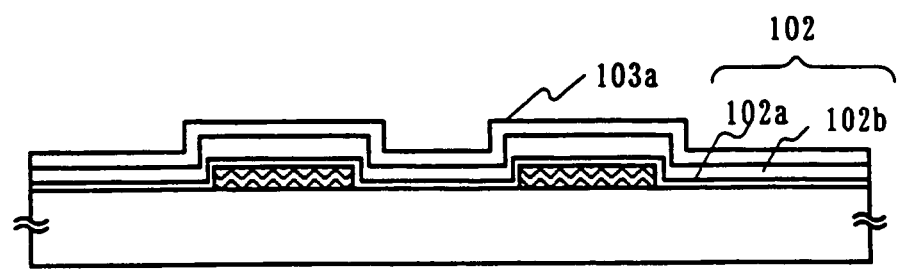
Figure 9C:
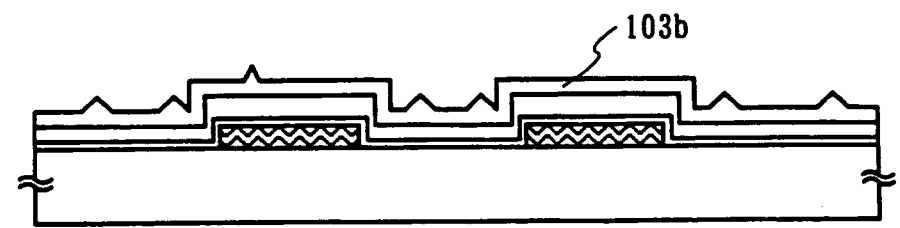
Figure 9D:
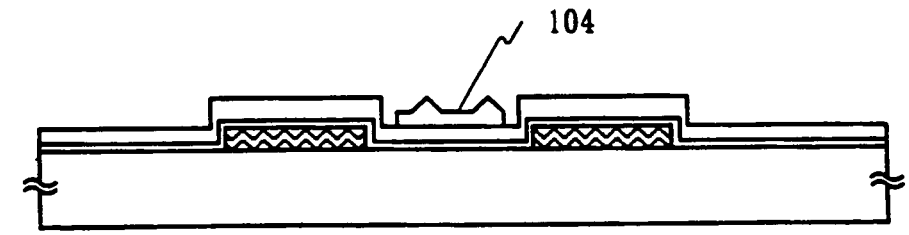
Figure 10:
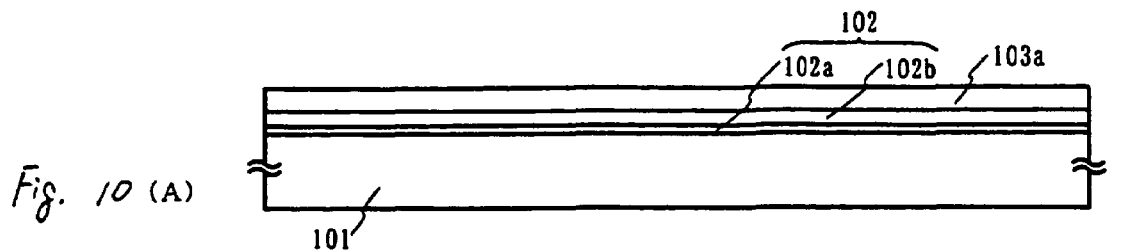
FIGS. 10(A) to 10(F) show a process flow of a TFT utilizing the present invention.
Figure 10:
Figure 10:
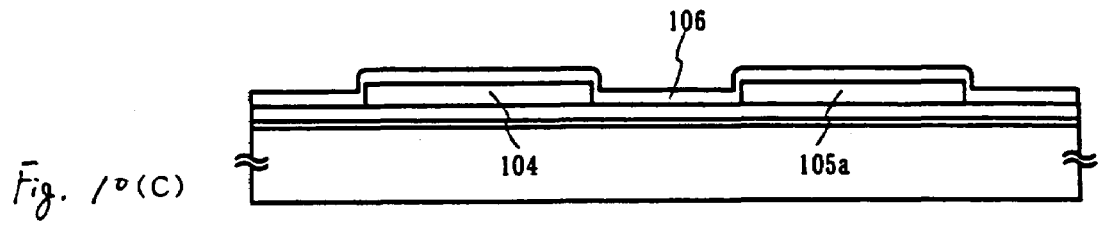
Figure 10:
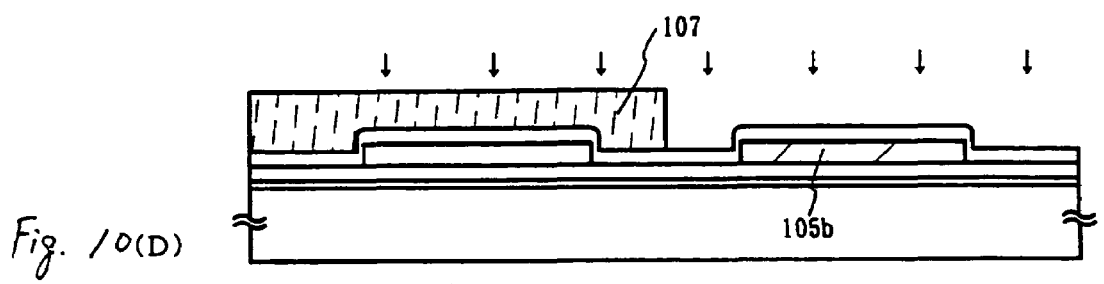
Figure 10:
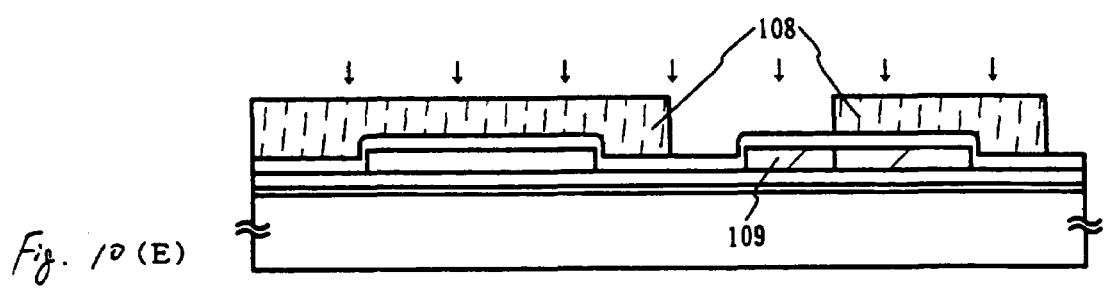
Figure 10:
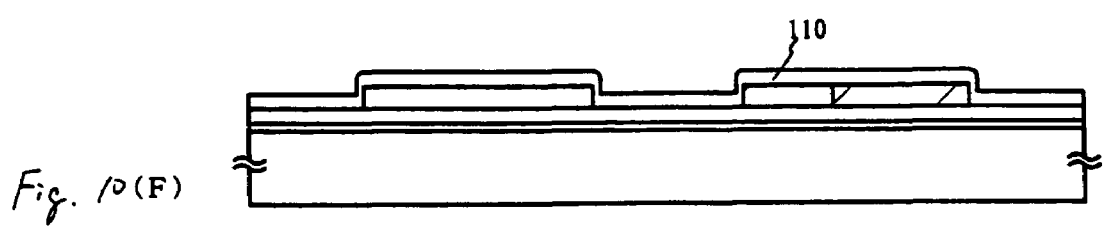
Figure 11:
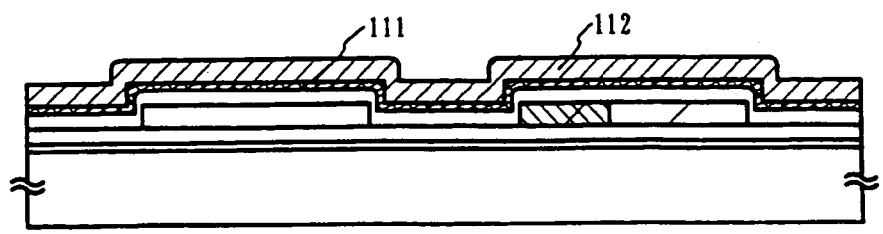
FIGS. 11(A) to 11(F) show a process flow of a TFT utilizing the present invention.
Figure 11:
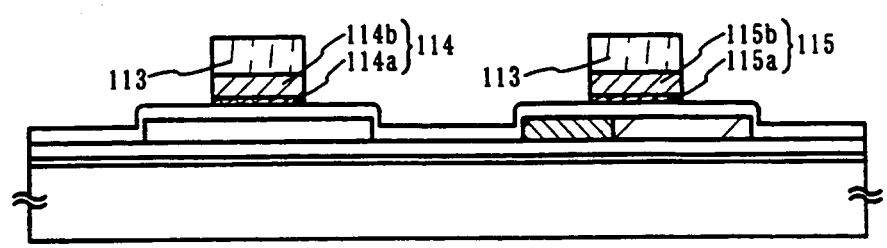
Figure 11:
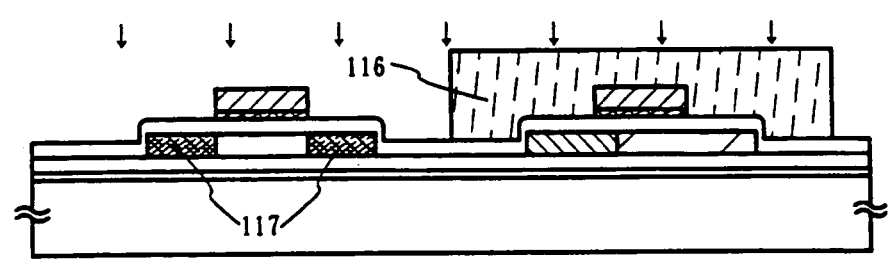
Figure 11:
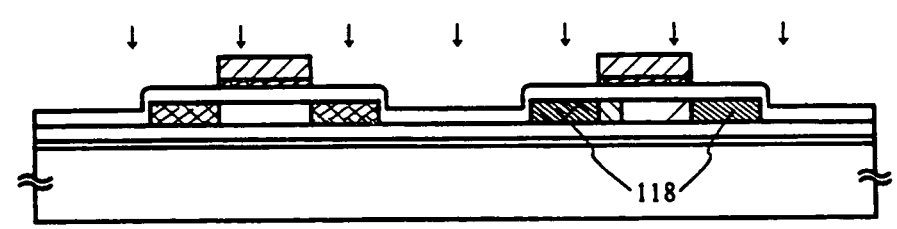
Figure 11:
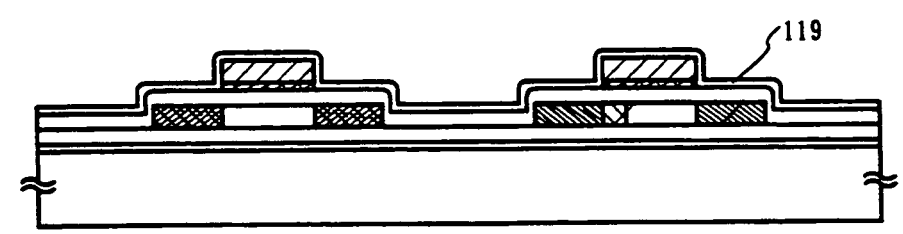
Figure 11:
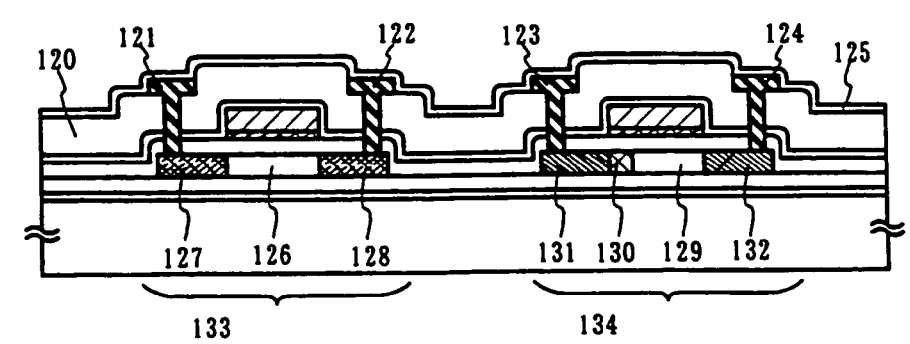

FIGS. 8(A) to 8(C) show schematic views of a structure in accordance with the present invention, in which FIG. 8(A) is a plan view, FIG. 8(B) is a cross sectional view taken on a line Y1–Y2, FIG. 8(C) is a cross sectional view taken on a line X1–X2. The drawings show a heat absorbing layer 1101 formed on a substrate 1100, an active layer 1103 formed via the absorbing layer 1101 and an underlying film 1102, a gate insulating film 1104, and a gate electrode 1105. In this case, a current path is parallel to the line X1–X2 (i.e. channel length direction) and one side of the heat absorbing layer 1101 is arranged in parallel to the current path. This aligns protrusions 1111 in the direction parallel to the current path.

FIGS. 9(A) to FIG. 11(F) are schematic views of a process flow. FIGS. 9(A) to 9(D) correspond to the cross section in FIG. 8(C) and show a cross sectional structure including a heat absorbing layer. FIGS. 10(A) to 10(F) and 11(A) to 11(F) correspond to FIG. 8(B) and show cross section not including the heat absorbing layer.

To begin with, Ta 100 is formed as a heat absorbing body in a thickness of 200 nm on a glass substrate 101 by DC sputtering and is patterned by using a predetermined pattern. Here, while Ta is used, it is not intended to limit a material to Ta, and a material which is largely different in a thermal conductivity from a glass substrate and an underlying film to be subsequently formed may be employed; for example, a metal material such as tungsten or the like or a semiconductor material such as silicon or the like, or the mixtures of these materials may be employed.

Subsequently to the formation of the heat absorbing layer, a silicon oxide nitride film (A) 102a is formed as an underlying film in a thickness of 50 nm and a silicon oxide nitride film (B) 102b is laminated thereon in a thickness of 100 nm to make a blocking layer 102. Subsequently, an amorphous silicon film 103a is formed in a thickness of 30 nm. Then, the formed films are subjected to a heat treatment at 500° C. for one hour to release hydrogen from the amorphous silicon film.

Figure 1A:
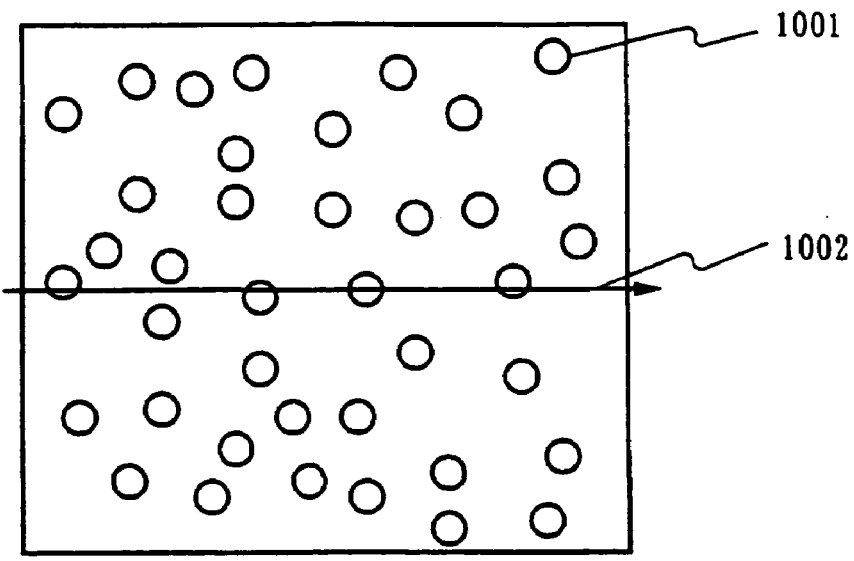
FIGS. 1(A) and 1(B) are conceptional views of a conventional example.
Figure 1B:
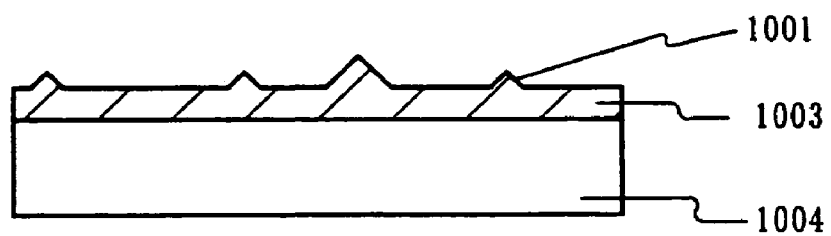
Figure 2A:
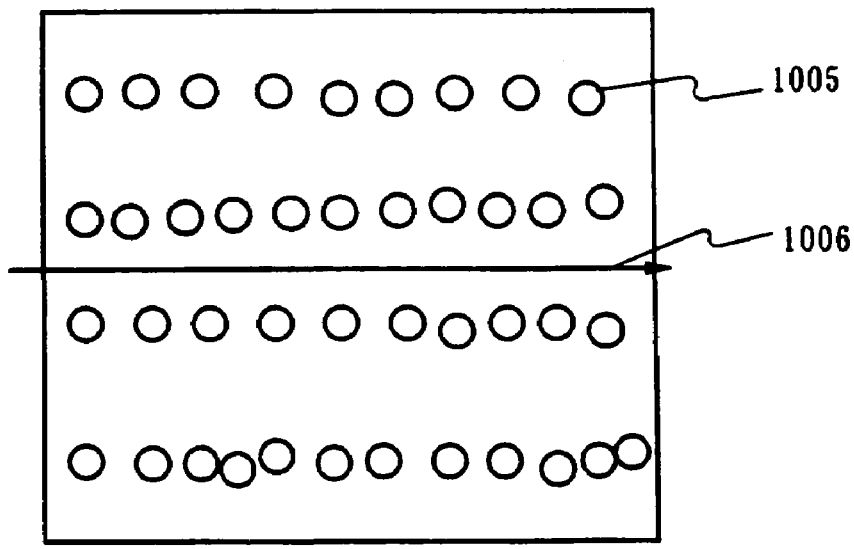
FIGS. 2(A) and 2(B) are conceptional view of the present invention.
Figure 2B:
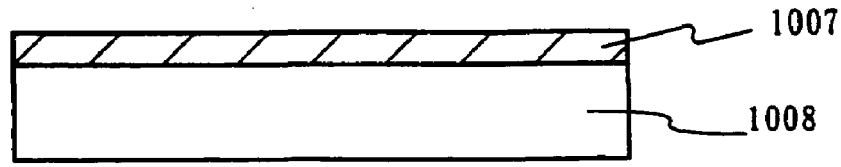
Figure 3:
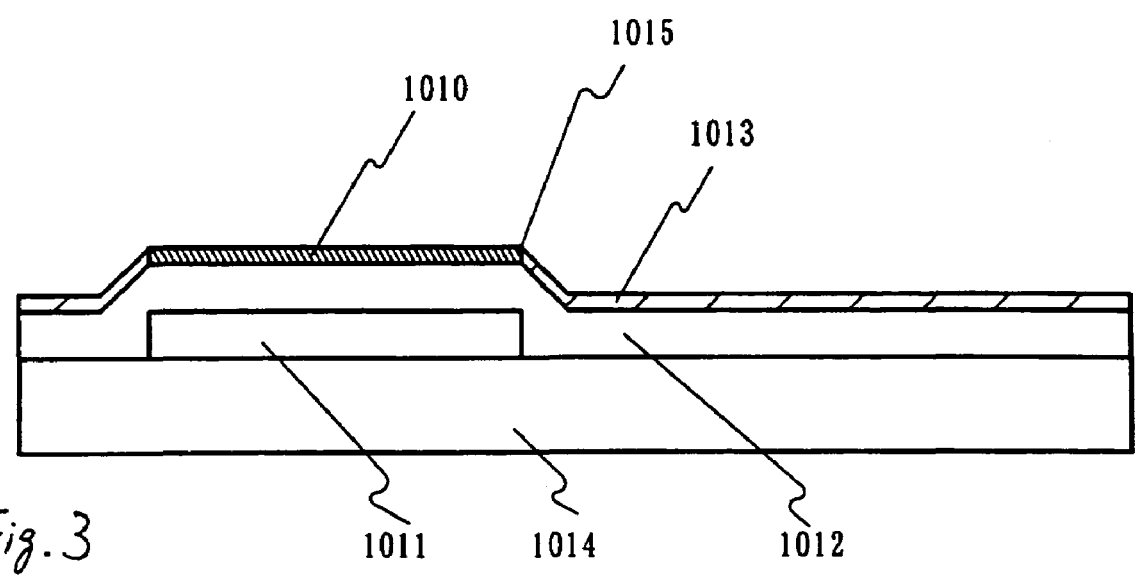
FIG. 3 is a schematic cross sectional view illustrating a state of semiconductor thin film when it is annealed by a laser.
Figure 4:
FIG. 4 is a photograph (SEM photograph) of the surface of a semiconductor thin film after laser annealing.
Figure 5:
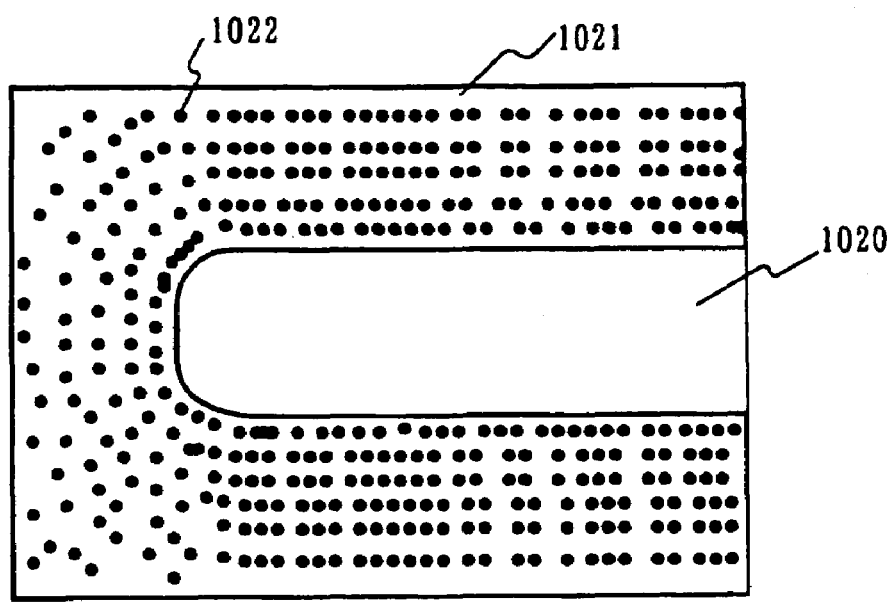
FIG. 5 is a schematic view of the surface of a semiconductor thin film after laser annealing.
Figure 6:
FIG. 6 is the result of the AFM observation of the surface of a semiconductor thin film after laser annealing.
Figure 7:
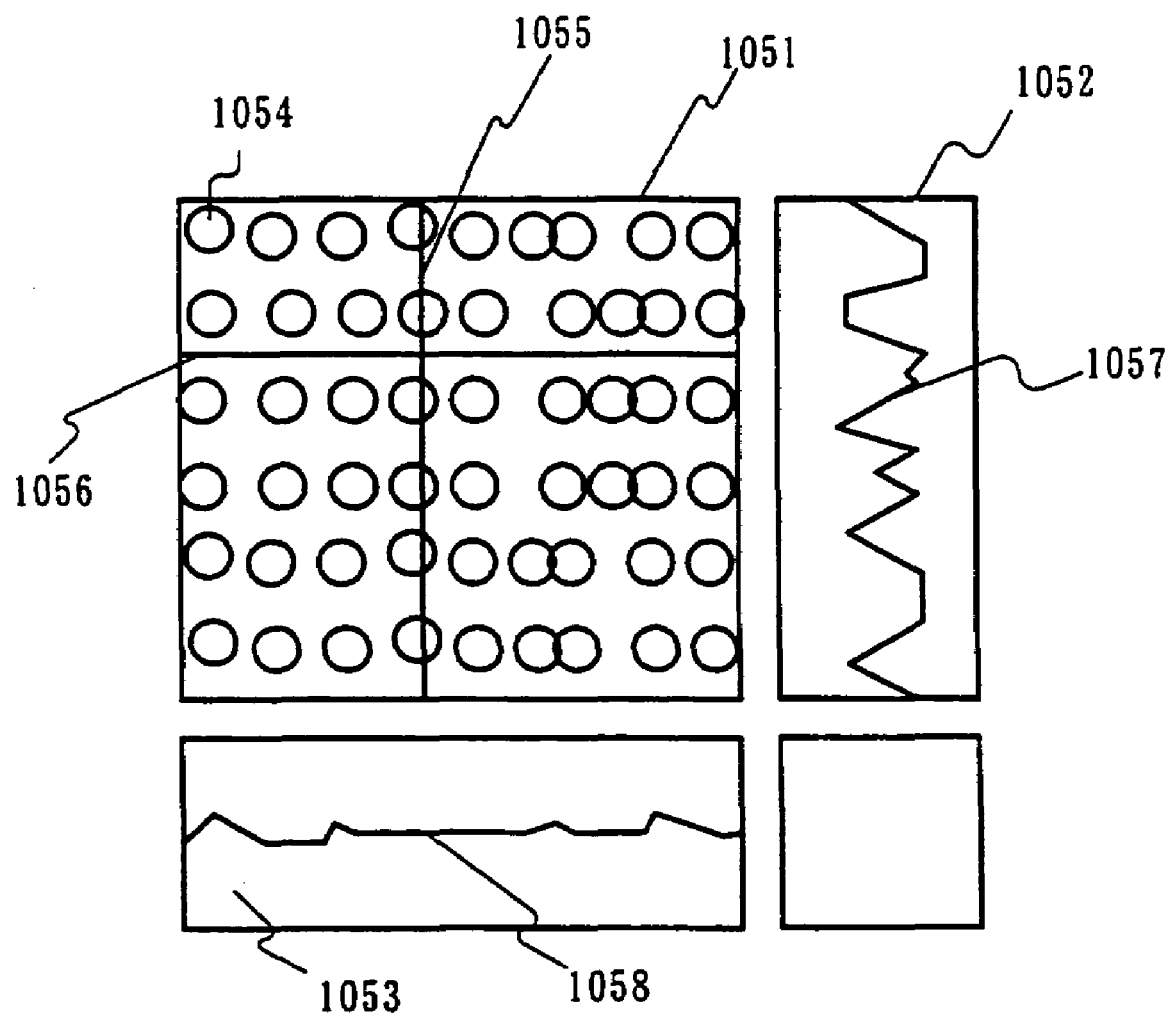
FIG. 7 is a schematic view of the result of n AFM observation of the surface of a semiconductor thin film after laser annealing.

Subsequently, an excimer laser is applied to the amorphous silicon film to melt and solidify the amorphous film to produce a crystalline semiconductor layer 103b. The applied energy is acceptable if it can melt and solidify the amorphous film and depends on the film thickness of the amorphous film. A proper amount of energy for a 30 nm thick a-Si film is 100 mJ/cm$^2$ to 500 mJ/cm$^2$ and preferably about 300 mJ/cm$^2$. The number of laser shots are 1 shot to 100 shots, preferably, 5 shots to 50 shots. The energy density of the laser, however, varies largely according to a change in the profile of the laser light or the like, and thus can not be uniquely defined. If the laser is actually applied to the amorphous film to melt and solidify the film, that is, to form protrusions on the surface thereof, the energy density of the laser satisfies the constitution of the present invention. When the laser is applied to the amorphous film, protrusions are aligned in the shape of ripples around the Ta pattern formed as a heat absorbing layer. FIG. 4 corresponds the observed image of the surface at this step. In the present preferred embodiment, the excimer laser was employed but the other lasers, for example, a YAG laser, a YVO$_4$ laser and the like may also produce the like effects. Also, other energy sources may be used instead of laser. For example, an RTA (rapid thermal annealing) using a lamp may be used if the crystallization through melting occurs.

Subsequently, the semiconductor layer 103b is patterned by using a predetermined pattern to produce a semiconductor layer 104. Further, subsequently, the semiconductor layer is subjected to a standard top gate process to form a TFT. Here, a gate electrode is formed in the direction perpendicular to the line of the aligned protrusions, whereby the carriers are made to flow parallel to the line of the protrusions, that is, an electric current path can be produced which is not affected by the surface dispersion due to the protrusions. These procedures will be hereinafter described. For the sake of simplicity, the description will be made by the use of a cross section including no heat absorbing layer (see FIGS. 10, 11). Processes following the crystallization of the amorphous layer will be described in detail.

A photoresist pattern is formed on the crystalline semiconductor layer 103b and the crystalline semiconductor layer 103b is divided by dry etching into islands to form semiconductor layers 104, 105a as active layers. A mixed gas of CF$_4$ and O$_2$ is used for the dry etching. Thereafter, a mask layer 106 made of a silicon oxide film and having a thickness of 50 nm to 100 nm is formed by a plasma CVD method, a low pressure CVD method, or a sputtering method. For example, in the case of using the plasma CVD method, tetraethyl orthosilicate (TEOS) is mixed with $O_2$ and the resultant mixture is discharged to form a mask layer having a thickness of 100 nm to 150 nm, typically 130 nm, under the following conditions: a reactive pressure of 40 Pa, a substrate temperature of 300° C. to 400° C., a high frequency of 13.56 MHz, and a power density of 0.5 W/cm² to 0.8 W/cm².

Then, a photoresist mask 107 is placed on the mask layer 106 and the semiconductor layer 105a, which is to be formed into an n-channel type TFT, is doped with impurity elements producing a p-type at a concentration of about $1\times10^{16}$ atoms/cm³ to $5\times10^{17}$ atoms/cm³ for the purpose of controlling a threshold voltage. (FIG. 10(D)) Elements belonging to the XIII group in a periodic table, such as boron (B), aluminum (Al), gallium (Ga) or the like are known as the impurity elements giving the semiconductor the p-type. Here, the semiconductor layer 105b was doped with boron (B) by the use of diborane ($B_2H_6$) and by an ion doping method. Doping the semiconductor layer 105b with boron (B) is not necessarily required and can be omitted. However, the semiconductor layer 105b doped with boron (B) was formed to bring the threshold voltage of the n-channel type TFT into a predetermined range.

To form the LDD region of the n-channel type TFT, the semiconductor layer 105b is selectively doped with impurity elements giving the n-type. Elements belonging to the XV group in a periodic table, such as phosphorus (P), arsenic (As), antimony (Sb), or the like are known as the impurity elements giving the semiconductor the n-type. A photoresist mask 108 was formed and the ion doping method using phosphine ($PH_3$) was employed to dope the semiconductor layer with phosphorus (P). The concentration of phosphorus (P) in the formed impurity region 109 ranges from $2\times10^{16}$ atoms/cm³ to $5\times10^{19}$ atoms/cm³. In the present specification, the concentration of the impurity element giving the n-type and contained in the impurity region 109 will be expressed by a symbol (n–). (FIG. 10(E))

Next, the mask layer 106 was removed by an etching liquid such as a hydrofluoric acid diluted with pure water. Then, a process was performed for activating the impurity elements with which the semiconductor layer 105b was doped in FIGS. 10(D) and 10(E). The activation process can be performed by a method such as a thermal annealing at 500° C. to 600° C. for 1 hour to 4 hours in a nitrogen atmosphere or a laser annealing. Also, both the methods may be used at the same time. In the present preferred embodiment, a laser activation method was employed, that is, a linear laser beam having an oscillation frequency of 5 Hz to 50 Hz and an energy density of 100 mJ/cm² to 500 mJ/cm² was formed by means of KrF excimer laser light (having a wavelength of 248 nm) and the whole surface of the substrate on which the semiconductor layer was formed was scanned with the linear laser beam with an overlapping ratio of 80% to 98%. In this respect, there is no restriction to the conditions of irradiation of the laser light and the operator can determine suitable conditions.

Next, a gate insulating film 110 is formed of an insulating film containing silicon and having a thickness of 40 nm to 150 nm by the plasma CVD or by the sputtering method. For example, it is recommended that a silicon oxide nitride film (B) be formed in a thickness of 120 nm. The gate insulating film may be formed of a single or laminated structural insulating film containing other silicon compound.

Referring to FIG. 11(A), on the gate insulating film is formed a conductive layer to form a gate electrode. The conductive layer may be a single layer or may be formed of a laminated structure of two or three layers if necessary. In the present preferred embodiment, a conductive layer (A) 111 made of a conductive metal nitride film and a conductive layer (B) 112 made of a metal film were laminated. The conductive layer (B) 112 may be formed of an element selected from the group consisting of tantalum (Ta), titanium (Ti), molybdenum (Mo), and tungsten (W), or alloys mainly composed of these elements, or an alloy film made of a combination of these elements (typically, Mo—W alloy film, Mo—Ta alloy film), whereas the conductive layer (A) 111 may be formed of a tantalum nitride (TaN), tungsten nitride (WN), titanium nitride (TiN), molybdenum nitride (MoN), or the like. Also, the conductive layer (A) 111 may be formed of tungsten silicide, titanium silicide, or molybdenum silicide. It is recommended that the concentrations of the impurities contained in the conductive layer (B) 112 be reduced to reduce its resistance. In particular, we had good results when the concentration of oxygen was reduced to 30 ppm or less. For example, when the concentration of oxygen contained by tungsten (W) was reduced to 30 ppm or less, the specific resistance of the conductive layer (B) 112 could be reduced to 20 µΩcm or less.

Preferably, the conductive layer (A) 111 be formed in a thickness of 10 nm to 50 nm (preferably, 20 nm to 30 nm), whereas the conductive layer (B) 112 be formed in a thickness of 200 nm to 400 nm (preferably, 250 nm to 350 nm). In the present preferred embodiment, the conductive layer (A) 111 was formed of a TaN film having a thickness of 30 nm, whereas the conductive layer (B) 112 was formed of a Ta film having a thickness of 350 nm. Both of the films were formed by the sputtering method; that is, the TaN film was formed by using a Ta target and a mixed gas of an argon gas and a nitrogen gas, whereas the Ta film was formed by using an argon gas as a sputtering gas. Adding a proper amount of Xe or Kr to these sputtering gases can reduce the internal stress generated in the formed film to prevent the separation of the film. The specific resistance of the Ta film of an α phase was about 20 µΩcm and could be used as the gate electrode, but the specific resistance of the Ta film of a β phase was about 180 µΩcm and could not be used as the gate electrode. Since the TaN film has a crystalline structure close to an α phase, with a Ta film formed on the Ta film, the Ta film of an α phase was readily produced. In this connection, though not shown, it is effective to form a silicon film doped with phosphorus (P) in a thickness of 2 nm to 20 nm under the conductive layer (A) 111. This silicon film can improve the adhesive property of the conductive film to be formed thereon and prevent oxidization thereof and can prevent a small amount of alkaline element contained by the conductive layer (A) or the conductive layer (B) from diffusing into the gate insulating film 110. At any rate, it is preferable that the specific resistance of the conductive layer (B) be brought into a range from 10 µΩcm to 500 µΩcm.

Next, as shown in FIG. 11(B), a photoresist mask 113 is formed and the conductive layer (A) 111 and the conductive layer (B) 112 are integrally etched to form gate electrodes 114, 115. For example, they can be etched by using a mixed gas of $CF_4$ and $O_2$, or $Cl_2$ at a reactive pressure of 1 Pa to 20 Pa by a dry etching method. The gate electrode 114 is integrally formed of the conductive layer (A) 114a and the conductive layer (B) 114b, whereas the gate electrode 115 is integrally formed of the conductive layer (A) 115a and the conductive layer (B) 115b. Here, the n-channel type TFT gate electrode 115 is formed such that it overlaps a part of the impurity region 109 via the gate insulating film 110. Also, the gate electrode can be formed only of the conductive layer (B).

Next, as shown in FIG. 11(C), an impurity region 117 to be the source region and the drain region of a p-channel type TFT is formed. Here, the semiconductor layer 104 is doped with the impurity elements giving the p-type by using the gate electrode 114 as a mask to form the impurity region 117 in a self-alignment manner. Here, the semiconductor layer 104 which is to form the n-channel type TFT is covered with the photoresist mask 116. The impurity region 117 is formed by the ion doping method using diborane ($B_2H_6$) such that the concentration of boron (B) in this region is $3 \times 10^{20}$ atoms/cm$^3$ to $3 \times 10^{21}$ atoms/cm$^3$. In the present specification, the concentration of the impurity element contained by the impurity region 114 formed in this way and giving the p-type will be expressed by a symbol (p+).

Next, as shown in FIG. 11(D), an impurity region 118 to be the source region and the drain region of the n-channel type TFT is formed by the ion doping method using phosphine ($PH_3$) such that the concentration of phosphorus (P) in this region is $1 \times 10^{20}$ atoms/cm$^3$ to $1 \times 10^{21}$ atoms/cm$^3$. In the present specification, the concentration of the impurity element contained by the impurity regions 138 to 142 formed in this way and giving the n-type will be expressed by a symbol (n+). Although the impurity region 117 is also doped with phosphorus (P) at the same time, the concentration of the phosphorus (P) added to the impurity region 117 is about ½ to ⅓ times the concentration of boron (B) having been added in the previous process and therefore the p-type conductivity can be secured and nothing affects the characteristics of the TFT.

Thereafter, a process for activating the impurity elements added in the respective concentrations to give the n-type or the p-type is performed by a thermal annealing method. It is recommended that this process be performed by an annealing furnace, a laser annealing method, or a rapid thermal annealing (RTA) method. The annealing treatment is performed in the concentration of oxygen of 1 ppm or less, preferably, 0.1 ppm or less, in a nitrogen atmosphere at a temperature of 400° C. to 700° C., typically, 500° C. to 600° C. In the present preferred embodiment, the annealing treatment was performed at a temperature of 550° C. for four hours. It is recommended that a protective insulating layer 119 having a thickness of 50 nm to 200 nm be formed of a silicon oxide nitride film, a silicon oxide film, or the like before the annealing treatment. The silicon oxide nitride film can be formed under any condition shown in a table 1 and, in addition, it is recommended that the silicon oxide nitride film be formed by using $SiH_4$ at 27 SCCM and $N_2O$ at 900 SCCM under the conditions of a reactive pressure of 160 Pa, a substrate temperature of 325° C., and a discharge power density of 0.1 W/cm$^2$.

After the activation process, the semiconductor layer was further subjected to another heat treatment in an atmosphere containing 3% to 100% hydrogen at temperatures of 300° C. to 450° C. for 1 hour to 12 hours, whereby the semiconductor layer was hydrogenated. This is a process for terminating the dangling bonds of the semiconductor layer by the thermally excited hydrogen. A plasma hydrogenation (using hydrogen excited by plasma) may be employed as another means for hydrogenation.

After the activation process and the hydrogenation process, a silicon oxide nitride film or a silicon oxide film is laminated on the protective insulating layer to form an interlayer insulating layer 120. The silicon oxide nitride film is formed in a thickness of 500 nm to 1500 nm (preferably, 600 nm to 800 nm) by using $SiH_4$ at 27 SCCM and $N_2O$ at 900 SCCM under conditions of a reactive pressure of 160 Pa, a substrate temperature of 325° C., and a discharge power density of 0.15 W/cm$^2$, as is the case with the protective insulating layer 119.

Thereafter, contact holes extending to the source region and the drain region of the TFT are made in the interlayer insulating layer 120 and the protective insulating layer 119 to form source wirings 121, 124 and drain wirings 122, 123. Although not shown, in the present preferred embodiment, these electrodes were formed in the laminated structure of three layers of a 100 nm thick Ti film, a 300 nm thick aluminum film containing Ti, and a 150 nm thick Ti film which were continuously formed by the sputtering method.

Next, a silicon nitride film or a silicon oxide nitride film is formed as a passivation film 125 in a thickness of 50 nm to 500 nm (typically, 100 nm to 300 nm). Further, hydrogenation in this state was preferable for improving the properties of the TFT. For example, heat treatment in an atmosphere containing 3% to 100% hydrogen at temperatures of 300° C. to 450° C. for 1 hour to 12 hours, or plasma hydrogenation could produce the same effects. In this manner, an n-channel type TFT 134 and a p-channel type TFT 133 could be formed on the substrate 101. (FIG. 11(F))

In the p-channel type TFT 133, the semiconductor layer 104 has a channel forming region 126, a source region 127, and a drain region 128. In the n-channel type TFT 134, the semiconductor layer 105 has a channel forming region 129, a LDD region 130 overlapping the gate electrode 115 (hereinafter, the LDD region like this is referred to as Lov), a source region 132, and a drain region 131. The length of the Lov region in the direction of channel is 0.5 μm to 3.0 μm (preferably 1.0 μm to 1.5 μm) for the channel length of 3 μm to 8 μm. While each TFT has a single gate structure in FIG. 9, the TFT may have a double gate structure or a multi-gate structure having a plurality of gates.

Also, the current path which does not cross the protrusions in the active layer is not limited to a straight line but the current path shaped like a curved line or a bent line is included in the present invention.

Figure 12:
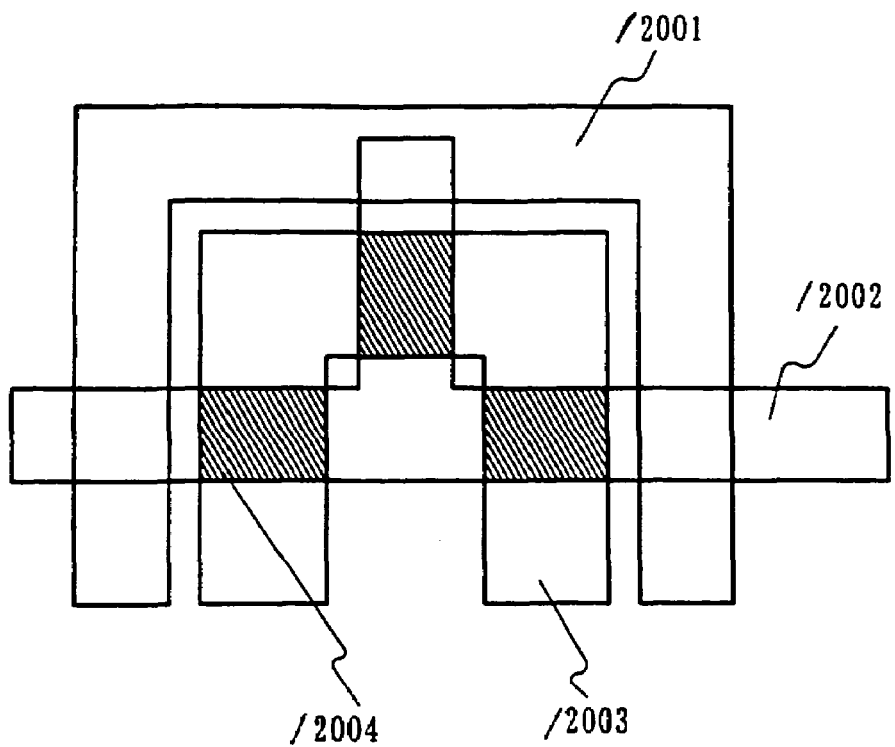
FIG. 12 is a TFT utilizing the present invention and having an active layer shaped like a letter C.
Figure 13:
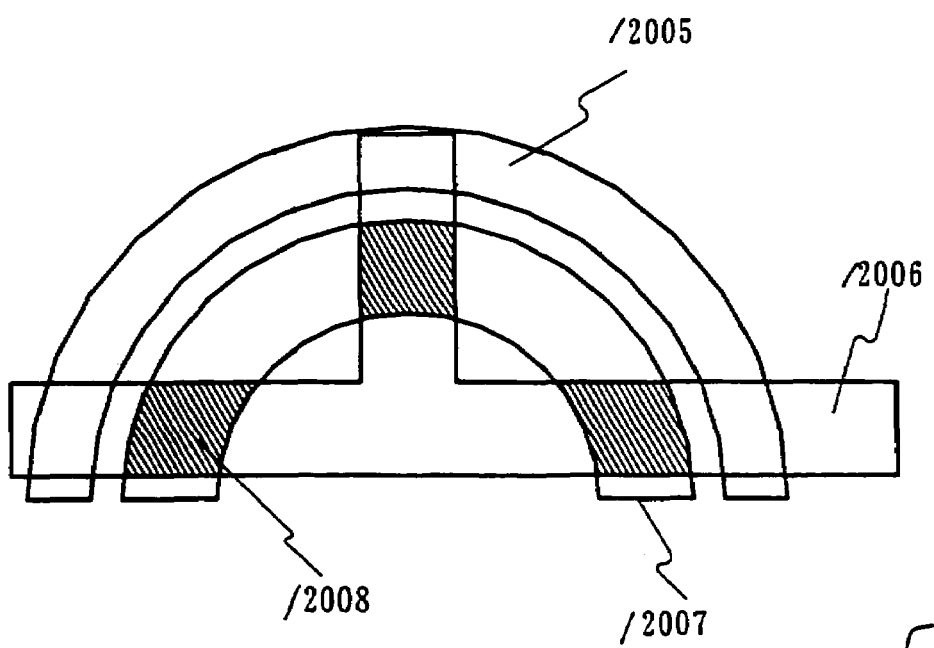
FIG. 13 is a TFT utilizing the present invention and having a semi-circular active layer.

The preferred embodiments of the bent current path and the curved current path will be shown in FIG. 12 and FIG. 13. FIG. 12 shows an example in which an semiconductor island 12003 is bent in the shape of letter C. This is a multi-gate structure with three gate electrodes 12002 in which the current path from the drain region to the source region is different in direction between the respective gates. Even in this case, in the respective gates, the protrusions are aligned in parallel to the current path in the respective channels 2004 to produce the effects of the present invention. The reference numeral 12001 shows the heat absorption layer in accordance with the present invention.

Also, FIG. 13 shows an example in which an active layer 12007 is semi-circular. Even in this case, the heat absorbing layer 12005 is concentrically arranged in the semi-circular shape and the protrusions are also concentrically arranged. Since the current path passes nearly concentrically, the protrusions are arranged in parallel to the current path.

EXAMPLE 1

An example in accordance with the present invention will be described with reference to FIGS. 14(A) to 19(D). Here, a method of making the pixel TFT of a pixel section and the TFT of a driving circuit formed around the pixel section on the same substrate will be described in detail according to the processes. For the sake of simplicity, a CMOS circuit, which is a basic circuit of a shift register circuit, a buffer circuit, or the like, and an n-channel type TFT forming a sampling circuit will be shown in a control circuit. FIGS. 14(A) to 18 show a sectional structure including no heat absorbing layer and FIGS. 19(A) to 19(D) show a sectional structure including the heat absorbing layer.

A barium borosilicate glass substrate or an aluminum borosilicate glass substrate is used as a substrate 201. In the present example, an aluminum borosilicate glass substrate was used. The substrate may be previously subjected to a heat treatment at a temperature lower than a glass strain point by about 10° C. to 20° C.

To begin with, a predetermined heat absorbing layer was formed on the surface of the substrate 201 where a TFT is to be formed. This is formed in the same process that is shown in the preferred embodiment. The heat absorbing layer may be arranged at both of the TFT of the pixel section and the TFT of the peripheral circuit, or at one of them. It is only essential that the heat absorbing layer be arranged at the portion requiring high mobility property. In the present example, the heat absorbing layer was arranged for the TFTs of the pixels and the driver circuit. (see FIG. 19(A)). As a material for the heat absorbing layer, it is possible to use various metals, for example, Cr, Mo, Ti, Ta and W.

Subsequently, to prevent impurities such as alkaline metal element or the like from diffusing in the substrate 201, a silicon oxide nitride film (A). 202a was formed in a thickness of 50 nm and further a silicon oxide nitride film (B) 202b was laminated thereon in a thickness of 100 nm to make a blocking layer 202.

Next, a semiconductor layer 203a having an amorphous structure and a thickness of 25 nm to 80 nm (preferably, 30 nm to 60 nm) is formed by a publicly known method such as plasma CVD, sputtering, or the like. In the present example, an amorphous silicon film was formed in a thickness of 55 nm by the plasma CVD method. Among semiconductor films having the amorphous structure are an amorphous semiconductor film and a fine crystalline semiconductor film, and a compound semiconductor film having the amorphous structure such as amorphous silicon germanium film or the like may be employed. Since the blocking layer 202 and the amorphous silicon layer 203a can be formed by the same film forming method, both layers may be continuously formed. This can prevent the surface of the layer from being contaminated because it is not exposed to the atmosphere after an underlying layer is formed, which can reduce variations in the properties and the threshold voltage of the TFT to be manufactured (see FIG. 14(A), FIG. 19(B)).

A crystalline silicon layer 203b is formed of the amorphous silicon layer 203a. Here, the crystalline silicon layer 203b was formed by a crystallization method using a catalytic element according to a technology disclosed in Japanese Patent Laid-Open No. 130652/1995 or U.S. Pat. No. 5,643,826 which corresponds to this Japanese patent. The disclosure of this U.S. patent is incorporated herein by reference. First, an aqueous solution containing a catalytic element of 10 ppm by weight was applied to the substrate by a spin coat method to form a layer containing the catalytic element (not shown). The catalytic element includes nickel (Ni), germanium (Ge), iron (Fe), palladium (Pa), tin (Sn), lead (Pb), cobalt (Co), platinum (Pt), copper (Cu), and gold (Au). In the crystallization process, the substrate was subjected to heat treatment at temperatures of 400° C. to 500° C. for about one hour to reduce the amount of hydrogen contained by the amorphous silicon layer to 5 atom % or less, and then to thermal annealing in a nitrogen atmosphere at temperatures of 550° C. to 600° C. for 1 hour to 8 hours in a annealing furnace to form a crystalline silicon film. In this step, the concentration of the catalytic element remaining on the surface was reduced to $3\times10^{10}$ atoms/cm$^2$ to $2\times10^{11}$ atoms/cm$^2$. Thereafter, laser annealing was performed to increase a crystallization ratio. A linear laser beam formed from a XeCl excimer laser (wavelength: 308 nm) by an optical system and having an oscillation frequency of 5 Hz to 50 Hz and an energy density of 100 mJ/cm$^2$ to 500 mJ/cm$^2$ was applied to the amorphous silicon layer at an overlapping ratio of the linear beam of 80% to 98% to thereby form the crystalline silicon film 203b. When the laser was applied to the semiconductor layer, the semiconductor layer was melted and solidified to form protrusions on the surface thereof, the protrusions being aligned along the heat absorbing body having being previously formed (see FIG. 19(C)).

The crystalline silicon film 203b was etched and divided into semiconductor layers 204 to 207 to form active layers. Here, the protrusions on the surface formed on the semiconductor layers aligned in the direction parallel to the electric current path during operation (see FIG. 19(D)). Thereafter, a 50 nm to 100 nm thick mask layer 208 made of a silicon oxide film was formed by the plasma CVD method, the low pressure CVD, or the sputtering method. For example, the silicon oxide film was formed by heating a mixed gas of SiH$_4$ and O$_2$ to a temperature of 400° C. at a pressure of 266 Pa. by the low pressure CVD (see FIG. 14(C)).

Subsequently, a channel doping process was performed. First, a photoresist mask 209 was formed and the whole surface of the semiconductor layers 205 to 207 forming the n-channel type TFT was doped with boron (B) as impurity elements giving the p-type at the concentration of about $1\times10^{16}$ atoms/cm$^3$ to $5\times10^{17}$ atoms/cm$^3$ for the purpose of controlling the threshold voltage. Doping with boron (B) may be performed by the ion doping method, or when the amorphous silicon film is formed, it may be doped with boron at the same time. It is not necessarily required here that the semiconductor layer be doped with boron (B), but it was preferable for bringing the threshold voltage of the n-channel type TFT into the predetermined range that the semiconductor layers 210 to 212 doped with boron (B) were formed. (see FIG. 14(D)).

To form the LDD region of the n-channel type TFT of the driving circuit, the semiconductor layers 210, 211 were selectively doped with impurity elements giving the n-type. For this purpose, photoresist masks 213 to 216 were formed in advance. The ion doping method using phosphine (PH$_3$) was employed to dope the semiconductor layers with phosphorus (P). The concentration of the formed impurity region (n$^-$) was $1\times10^{17}$ atoms/cm$^3$ to $5\times10^{17}$ atoms/cm$^3$. Also, the impurity region 219 is a semiconductor layer for forming the storage capacitance of the pixel section and thus this region was doped with the phosphorus (P) in the same concentration (see FIG. 15(A)).

Figure 14A:
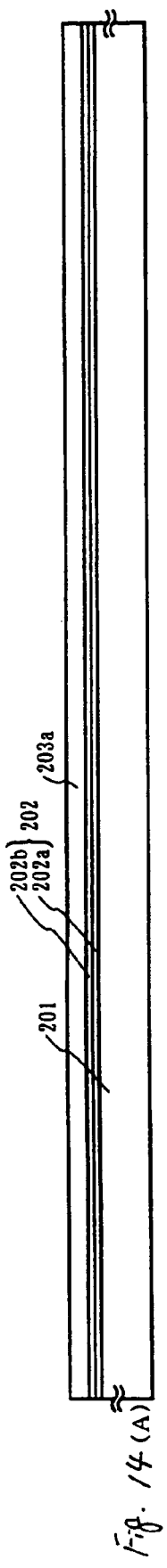
FIGS. 14(A) to 14(D) show a process flow of an active matrix substrate utilizing the present invention.
Figure 14B:
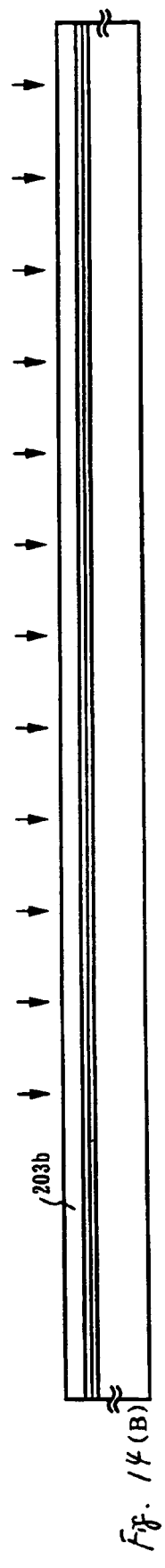
Figure 14C:
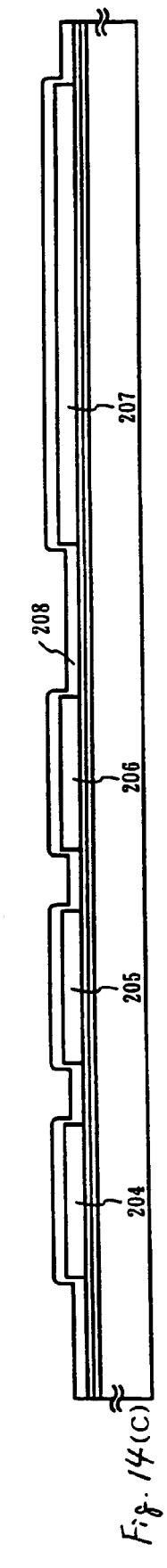
Figure 14D:
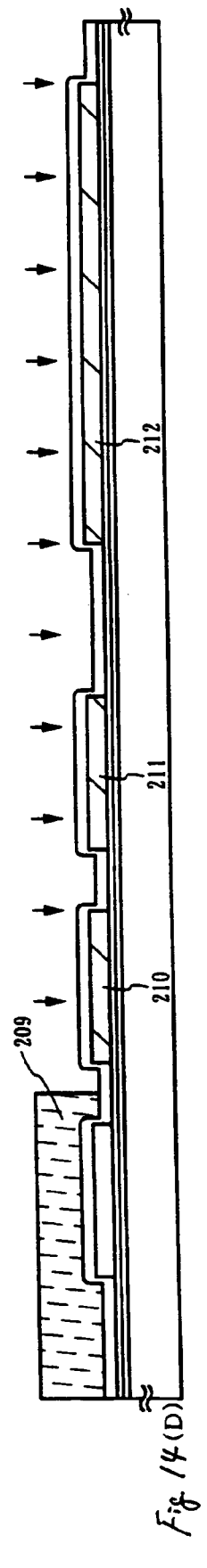
Figure 15A:
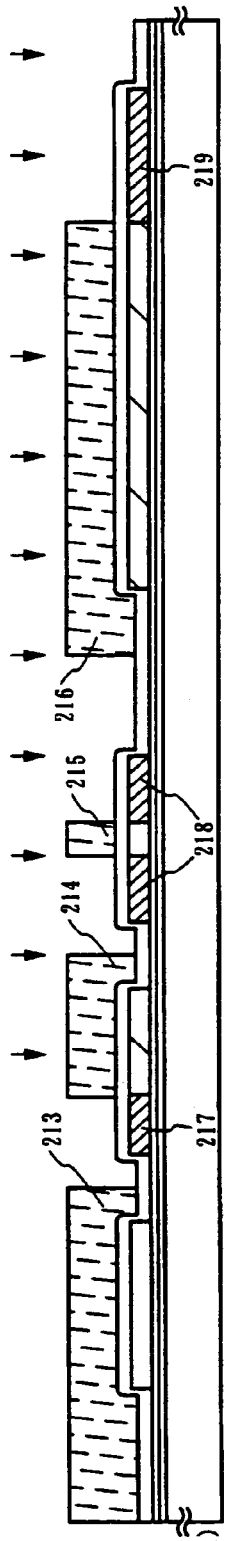
FIGS. 15(A) to 15(D) show a process flow of an active matrix substrate utilizing the present invention.
Figure 15B:
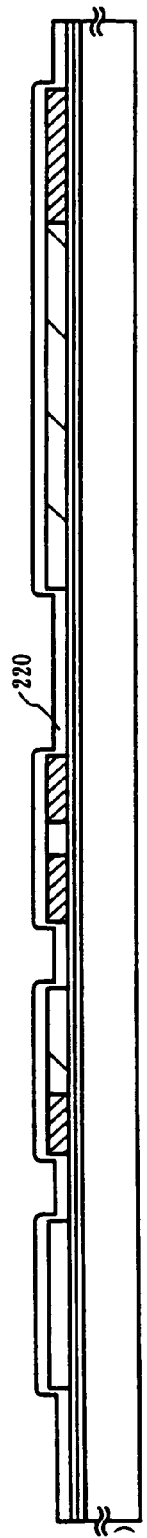
Figure 15C:
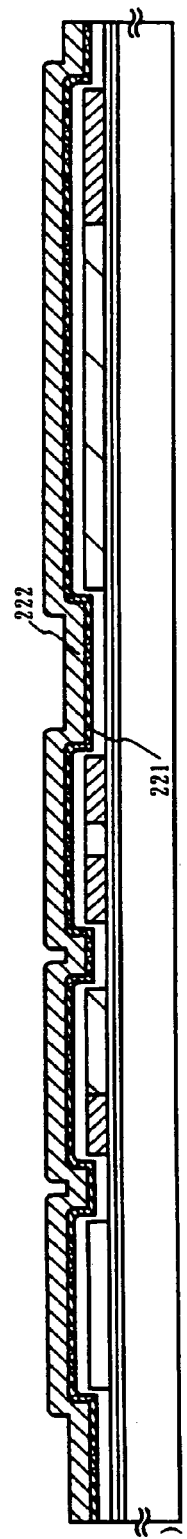
Figure 15D:
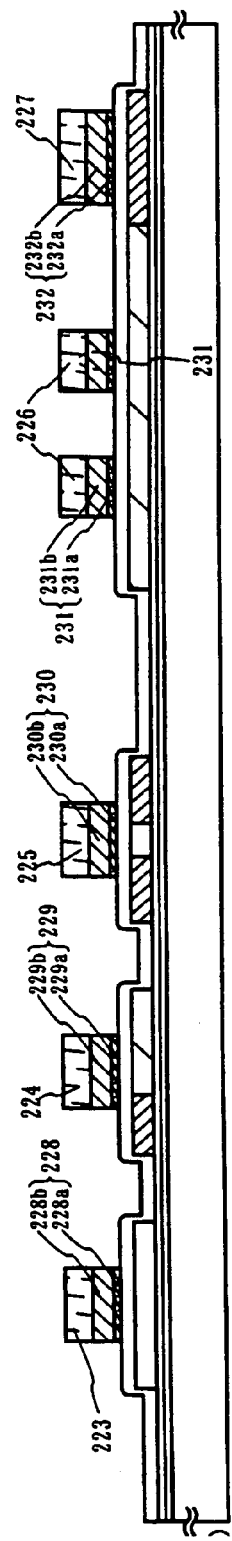
Figure 18:
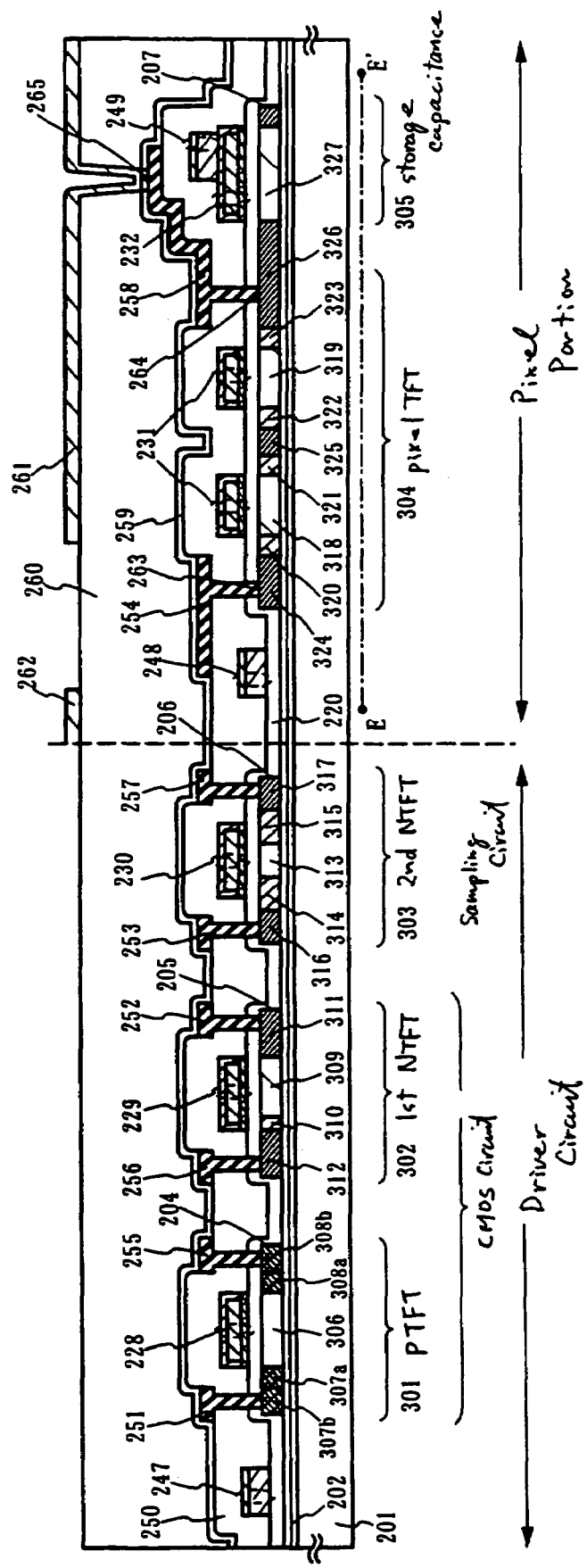
FIG. 18 is a process flow of an active matrix substrate utilizing the present invention.
Figure 19A:
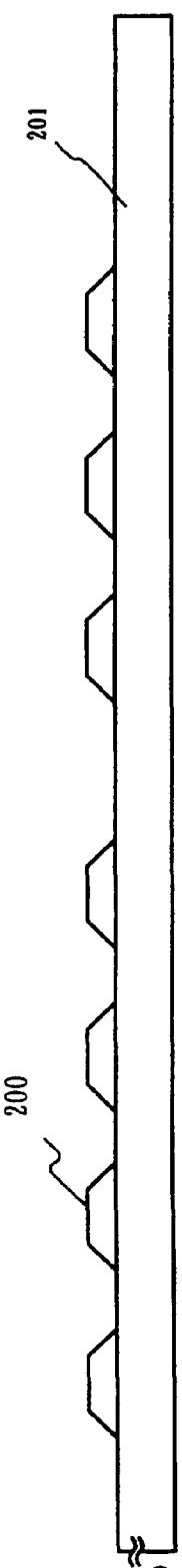
FIGS. 19(A) to 19(D) show a process flow of an active matrix substrate utilizing the present invention.
Figure 19B:
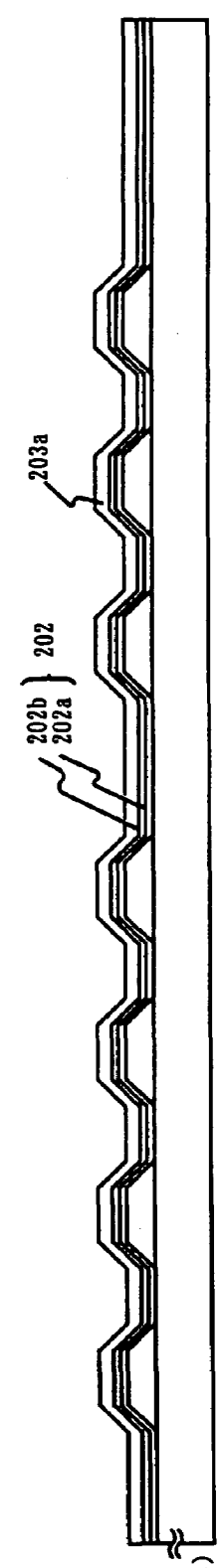
Figure 19C:
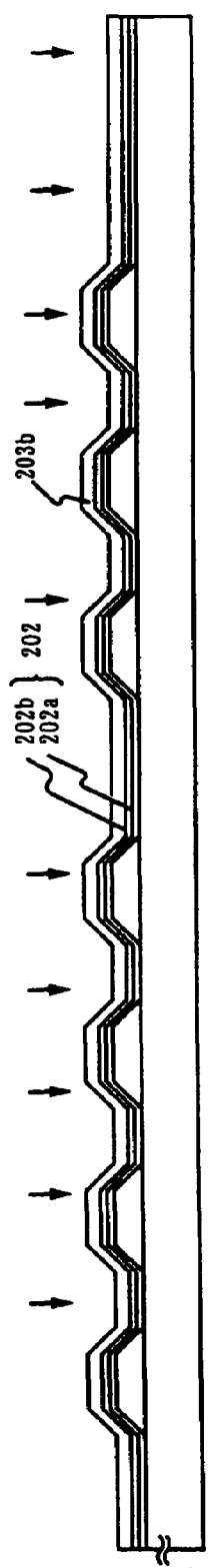
Figure 19D:
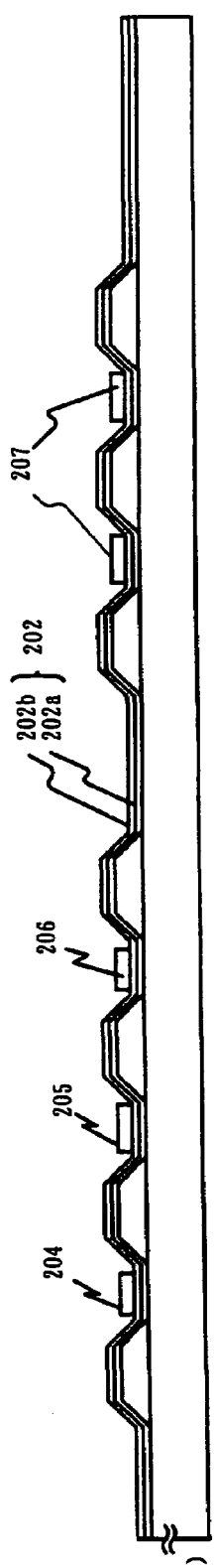

Next, the mask layer 208 was removed by a hydrofluoric acid or the like and a process for activating the impurity elements doped in FIG. 14(D) and FIG. 15(A) was performed. This activation process can be performed in a nitrogen atmosphere at temperatures of 500° C. to 600° C. for 1 hour to 4 hours by the methods of thermal annealing or laser annealing. Also, both the methods may be used at the same time. In the present example, the laser annealing method was employed, that is, the whole surface of the substrate on which the semiconductor layers were formed was scanned with a linear laser beam formed of a KrF excimer laser light (wavelength: 248 nm) and having an oscillation frequency of 5 Hz to 50 Hz and an energy density of 100 mJ/cm² to 500 mJ/cm² at the overlapping ratio of the linear beam of 80% to 98%. In this connection, there is no limitation to the conditions of applying laser light and the operator can determine suitable conditions, but it is preferable to select conditions in which the semiconductor is not melted because melting the semiconductor disturbs the alignment of the protrusions having been already aligned.

Subsequently, a gate insulating film 220 was formed of an insulating film containing silicon, for example, of a silicon oxide nitride film (B), and having a thickness of 40 nm to 150 nm by the plasma CVD method or the sputtering method. The gate insulating film may be formed in a single or laminated structure of the other insulating film containing silicon (see FIG. 15(B)).

Next, a first conductive layer is formed to form a gate electrode. In the present example, a conductive layer (A) 221 made of a conductive metal nitride film and a conductive layer (B) 222 made of a metal film were laminated. Here, the conductive layer (B) 222 was formed of tantalum (Ta) in a thickness of 250 nm and the conductive layer (A) 221 was formed of tantalum nitride (TaN) in a thickness of 50 nm by the sputtering method targeted at Ta (see FIG. 15(C)).

Subsequently, photoresist masks 223 to 227 were formed and the conductive layer (A) 221 and the conductive layer (B) 222 were etched by one operation to form gate electrodes 228 to 231 and a capacitance wiring 232. Each of the gate electrodes 228 to 231 and the capacitance wiring 232 was integrally formed of each of the conductive layers (A) 228a to 232a and each of the conductive layers (B) 228b to 232b. Here, the gate electrodes 229, 230 forming a driving circuit were formed such that they overlapped part of impurity regions 217, 218 via the gate insulating film 220 (see FIG. 15(D)).

Next, to form the source region and the drain region of the p-channel type TFT of the driving circuit, a process of doping with impurity elements giving the p-type was performed. Here, an impurity region was formed in a self-alignment manner by using the gate electrode 228 as a mask. The region in which the n-channel type TFT was to be formed was covered with the photoresist mask 233. Then, an impurity region (p−) 234 was formed in a concentration of $1 \times 10^{21}$ atms/cm³ by the ion doping method using diborane ($B_2H_6$) ((see FIG. 16(A)).

Next, impurity regions functioning as a source region or a drain region were formed in the n-channel type TFT. Photoresist masks 235 to 237 were formed and the semiconductor layers were doped with impurity elements giving the n-type to form impurity regions 238 to 242. This process was performed by the ion doping method using phosphine ($PH_3$) to set the concentration of phosphorus (P) of the impurity regions (n+) 238 to 242 at $5 \times 10^{20}$ atms/cm³. Although the impurity region 238 contained the boron (B) doped in the previous process, the concentration of the phosphorus (P) doped in this process was ½ to ⅓ times that of the boron (B) and thus it was not necessary to take account of the doped phosphorus (P) and the doped phosphorus (P) did not have any effect on the properties of the TFT (see FIG. 16(B)).

To form the LDD region of the n-channel type TFT of the pixel section, a process of doping with impurity giving the n-type was performed. The semiconductor layer was doped with impurity elements giving the n-type in a self-alignment manner by the ion doping method by using the gate electrode 231 as a mask. The concentration of the doped phosphorus (P) was set at $5 \times 10^{16}$ atms/cm³, which was smaller than that of impurity element doped in FIG. 15(A), FIG. 16(A), and FIG. 16(B), whereby only impurity regions (n−−) 243, 244 were substantially formed (see FIG. 16(C)).

Thereafter, to activate the impurity elements doped in the above concentrations and giving the n-type or the p-type, the semiconductor layer was subjected to heat treatment. The heat treatment process may be performed by the thermal annealing method using an annealing furnace, a laser annealing method, or a rapid thermal annealing (RTA) method. In this case, activating process was performed by the furnace annealing method. This heat treatment is performed in the nitrogen atmosphere where the concentration of oxygen is 1 ppm or less, preferably 0.1 ppm or less, at temperatures of 400° C. to 700° C., typically 500° C. to 600° C. In the present example, the heat treatment was performed at a temperature of 550° C. for 4 hours.

In this thermal annealing process, in the Ta films 228b to 232b forming the gate electrodes 228 to 231 and the capacitance wiring 232, conductive layers (C) made of TaN 228c to 232c were formed in the thickness of 5 nm to 80 nm from the surface. In addition, in the case where the conductive layers (B) 228b to 232b are made of tungsten (W), tungsten nitride (WN) can be formed and in the case where the conductive layers (B) 228b to 232b are made of titanium (Ti), titanium nitride (TiN) can be formed. Also, when the gate electrodes 228 to 231 are exposed to a plasma atmosphere containing nitrogen such as nitrogen or ammonia, the conductive layers can be formed in the like manner. Further, the semiconductor layers were subjected to the thermal annealing in an atmosphere containing 3% to 100% hydrogen at temperatures 300° C. to 450° C. for 1 hour to 12 hours to hydrogenate the semiconductor layers. This process is a process for terminating the dangling bonds of the semiconductor layer by the thermally excited hydrogen. Plasma hydrogenation (using hydrogen excited by plasma) may be employed as the other means for hydrogenation.

When the semiconductor layers were made from the amorphous silicon film by the crystallization method using the catalytic element in the present example, a small amount of the catalytic element (about $1 \times 10^{17}$ atms/cm³ to $1 \times 10^{19}$ atms/cm³) remained in the semiconductor layers. Of course, it is possible to complete the TFT in such a state, but it was more preferable that the remaining catalytic element was removed at least from the channel forming region. The gettering action of phosphorus (P) was employed as one means for removing the catalytic element. Since the concentration of phosphorus (P) necessary for the gettering action is acceptable if it is the same level as that of the impurity region (n+) formed in FIG. 16(B), the thermal annealing of the activation process performed here could segregate catalytic elements in the impurity regions 238 to 242 from the channel forming regions of the n-channel type TFT and the p-channel type TFT to perform the gettering action. As a result, the catalytic elements were segregated in the impurity regions 238 to 242 in the amount of $1 \times 10^{17}$ atms/cm³ to $1 \times 10^{19}$ atms/cm³.

When the activation and hydrogenation processes were finished, a second conductive layer to be a gate wiring was formed. The second conductive layer was formed of a conductive layer (D) mainly composed of aluminum (Al) or copper (Cu) having low resistance. At any rate, the specific resistance of the second conductive layer is set at about 0.1 μΩcm to 10 μΩcm. Further, it is recommended that a conductive layer (E) including titanium (Ti), tantalum (Ta), tungsten (W), molybdenum (Mo) be laminated. In the present example, a conductive layer (D) 245 was formed of an aluminum (Al) film containing, by weight, 0.1% to 2% titanium and a conductive layer (E) 246 was formed of a titanium (Ti) film. It is recommended that the conductive layer (D) 245 be 200 nm to 400 nm (preferably 250 nm to 350 nm) and that the conductive layer (E) 246 be 50 nm to 200 nm (preferably 100 nm to 150 nm) (see FIG. 17(A)).

Then, to form gate wirings to be connected to the gate electrodes, the conductive layer (E) 246 and the conductive layer (D) 245 were etched to form gate wirings 247, 248, and capacitance wiring 249. In the etching process, first, the conductive layer (E) 246 and the conductive layer (D) 245 were etched away from the top surface of the layer (E) 246 to the middle of the layer (D) 245 by a dry etching method using a mixed gas of $SiCl_4$, $Cl_2$, and $BCl_3$, and then the remaining layer (D) 245 was etched away by a wet etching method using a phosphoric acid base etching solution, thereby, the gate wirings were formed with a good etching selectivity with respect to the underlying layers.

A first interlayer insulating film 250 was formed of a silicon oxide film or a silicon oxide nitride film having a thickness of 500 nm to 1500 nm. In the present example, it was formed by using $SiH_4$ at 27 sccm and $N_2O$ at 900 sccm under the conditions of a reactive pressure of 160 Pa, a substrate temperature of 325° C., and a discharge power density of 0.15 W/cm². Thereafter, contact holes extending to the source region or the drain region formed in the semiconductor layer were formed, and source wirings 251 to 254 and the drain wirings 255 to 258 were formed. In the present example, although not shown, this electrode was formed of a laminated film having a three-layer structure which was formed by continuously forming a 100 nm thick Ti film, a 300 nm thick aluminum film containing Ti, and a 150 nm thick Ti film by the sputtering method.

Subsequently, a silicon nitride film, a silicon oxide film, or a silicon oxide nitride film was formed in a thickness of 50 nm to 500 nm (typically, 100 nm to 300 nm) as a passivation film. Hydrogenation processing in this state produced preferable effects on an improvement in the properties of the TFT. For example, the heat treatment in an atmosphere containing 3% to 100% hydrogen at temperatures of 300° C. to 450° C. for 1 hour to 12 hours produced good effects and the plasma hydrogenation processing also produced good effects. In this connection, it is also recommended that an opening be made at the position where a contact hole for connecting a pixel electrode to a drain wiring is formed in the later process (see FIG. 17(C)).

Thereafter, a second interlayer insulating film 260 made of organic resin was formed in a thickness of 1.0 µm to 1.5 µm. As the organic resin can be used polyimide, acrylic, polyamide, polyimide amide, BCB (benzocyclobutene), or the like. Here, the type of polyimide resin which was thermally polymerized after it was applied to substrate was used and burned at a temperature of 300° C. to form the second interlayer insulating film 260. Then, a contact hole extending to the drain wiring 258 were made in the second interlayer insulating film 260 and pixel electrodes 261, 262 were formed. It is recommended that for a transparent liquid crystal display, the pixel electrode be formed of a transparent conductive film, and that for a reflection-type liquid crystal display, the pixel electrode be formed of a metal film. In the present example, to make a transparent liquid crystal display, an indium tin oxide (ITO) film was formed in a thickness of 100 nm by the sputtering method (see FIG. 18).

In this manner, the substrate having the TFT of the driving circuit and the pixel TFT of the pixel section on the same substrate could be manufactured. A p-channel type TFT 301, a first n-channel type TFT 302, a second n-channel type TFT 303 were formed in the driving circuit, and a pixel TFT 304 and a storage capacitance 305 were formed in the pixel section. In this specification, for the sake of convenience, this kind of substrate is referred to as an active matrix substrate.

In the p-channel type TFT 301 of the driving circuit, the semiconductor layer 204 has a channel forming region 306, source regions 307a, 307b, and drain regions 308a, 308b. In the first n-channel type TFT 302, the semiconductor layer 205 has a channel forming region 309, an LDD region (Lov) 310 overlapping the gate electrode 229, a source region 311, and a drain region 312. The length of the Lov in the direction of the length of channel is 0.5 µm to 3.0 µm, preferably 1.0 µm to 1.5 µm. In the second n-channel type TFT 303, the semiconductor layer 206 has a channel forming region 313, a Lov region, and a Loff region (LDD region which does not overlap the gate electrode, and hereinafter referred to as Loff). The length of the Loff in the direction of the length of channel is 0.3 µm to 2.0 µm, preferably 0.5 µm to 1.5 µm. In the pixel TFT 304, the semiconductor layer 207 has channel forming regions 318, 319, Loff regions 320 to 323, and source or drain regions 324 to 326. The length of the Loff in the direction of the length of channel is 0.5 µm to 3.0 nm, preferably 1.5 µm to 2.5 µm. Further, a holding capacitance 305 is formed of the capacitance wirings 232, 249, an insulating film made of the same material as the gate insulating film, and a semiconductor layer 327 connected to the drain region 326 of the pixel TFT 304 and doped with impurity elements giving the n-type. While the pixel TFT 304 is formed in a double gate structure in FIG. 18, it may be formed in a single gate structure or a multi-gate structure provided with a plurality of gate electrodes.

Also, while the heat absorbing layer was used, in the present example, only for the purpose of aligning the protrusions on the semiconductor film, it may be used for forming wirings to make a multi-layer wiring structure, and may be also used as an electrode for forming an accumulation capacitance in the pixel.

Further, it may be used for producing the effects of the present invention on the TFT of the peripheral driver circuit while it is used for functioning only as a light shielding film. More concretely, the heat absorption layer can be disposed in order to align the protrusions in a direction along a current path only for the thin film transistors of a driver circuit, while the same layer is disposed below the thin film transistors of the display (pixel) region as a light shielding layer for preventing light from entering into at least a channel region of the thin film transistors.

Figure 25:
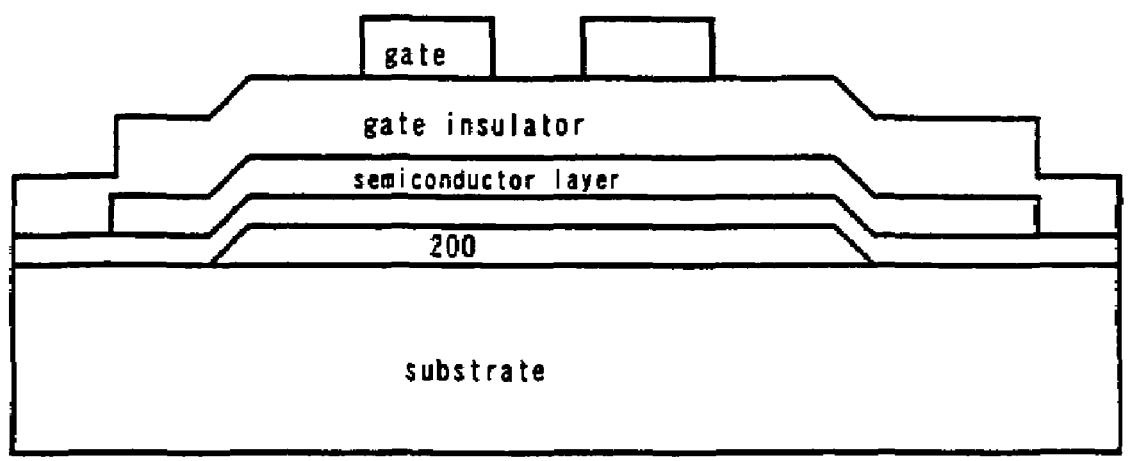
FIG. 25 shows a TFT in accordance with an example of the present invention.

FIG. 25 shows an example of the above TFT of the display region. The reference numeral 200' is the light shielding layer, which is formed from the same layer as the heat absorbing layer 200 used in the driver circuit. The details of this TFT are omitted from the figure since they may be basically the same as those described in conjunction with FIGS. 14A to 18. Also, this light shielding layer can be connected to a desired potential such as a ground level if desired.

EXAMPLE 2

Figure 20:
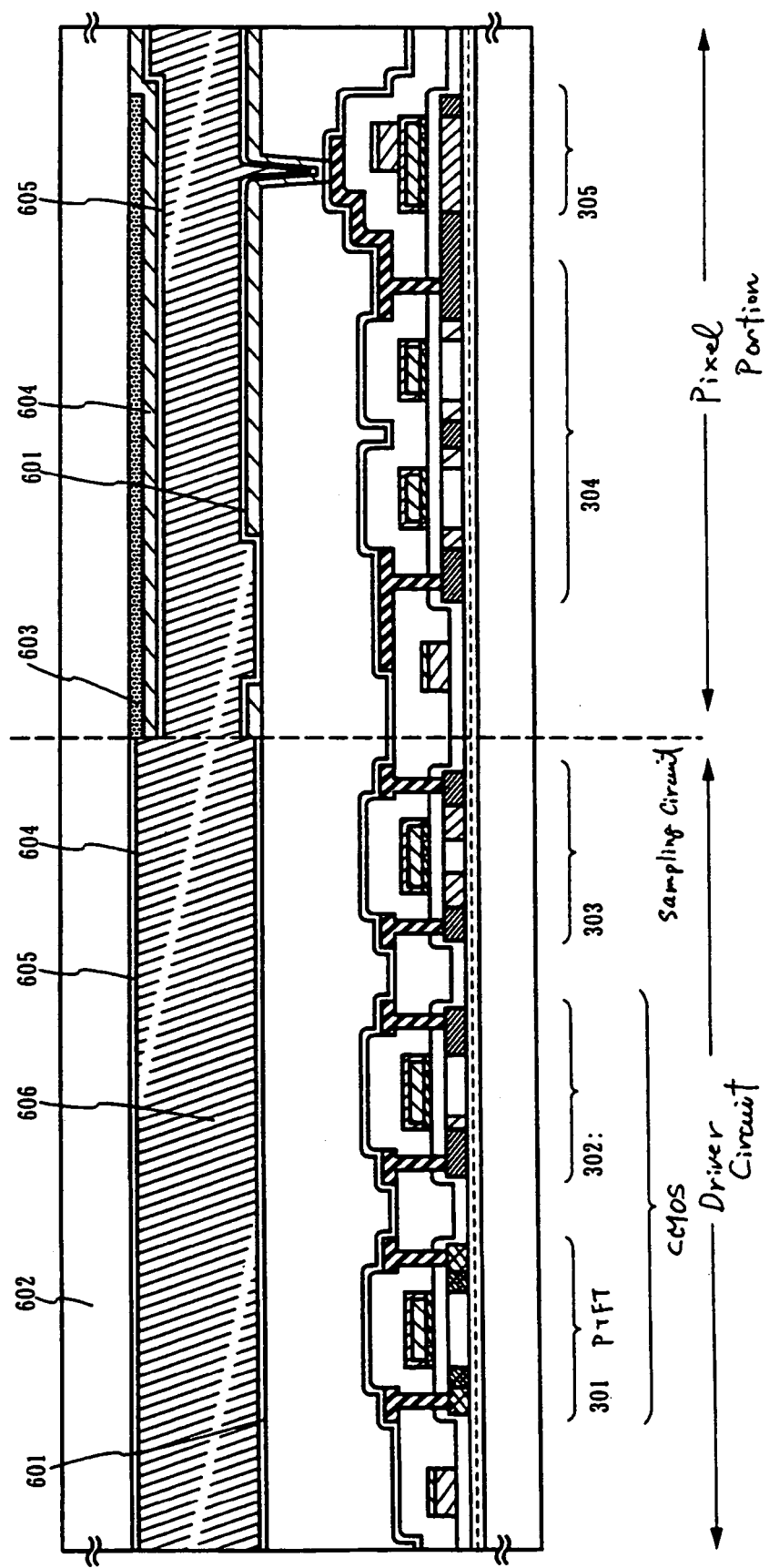
FIG. 20 is a cross sectional structure of an AMLCD utilizing the present invention.

In this embodiment, there will be described a process for fabricating an active matrix type liquid crystal display device from the active matrix substrate fabricated in Example 1. As shown in FIG. 20, an orientation film 601 is formed on the active matrix substrate in the state of FIG. 18. Usually, a polyimide resin is often employed for the orientation film of a liquid crystal display element. In a present example, an opposite substrate 602 on a side opposing to the active matrix substrate was formed with a light shielding film 603, a transparent conductive film 604 and an orientation film 605. After having been formed, each orientation film was subjected to a rubbing treatment so that liquid crystal molecules are oriented with a certain pre-tilt angle. Besides, the active matrix substrate formed with the pixel matrix circuit portion and the CMOS circuit was stuck with the opposite substrate through a sealing material (not shown), spacers (not shown) or the like by a known cell assemblage process. Thereafter, a liquid crystal material was injected between both the substrates, and the resulting assembly was completely sealed with a sealant (not shown). The liquid crystal material 606 may be any known one. In this way, the active matrix type liquid crystal display device shown in FIG. 19 was finished up.

Next, the construction of the active matrix type liquid crystal display device will be explained with reference to the perspective view of FIG. 21. Incidentally, common reference numerals are assigned to FIG. 21 in order to bring these figures into correspondence with the sectional structural views of FIG. 14 to FIG. 20.

Figure 21:
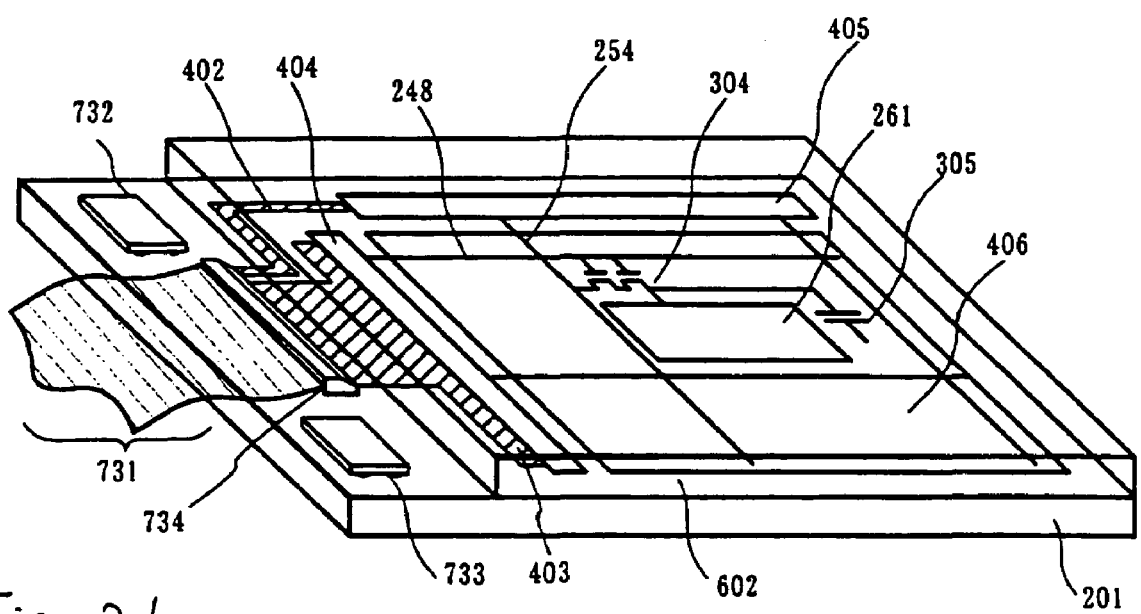
FIG. 21 is a top view of an AMLCD utilizing the present invention.

Referring to FIG. 21, the active matrix substrate is configured of a pixel portion 406, a scanning-signal driver circuit 404 and an image-signal driver circuit 405 which are formed on a glass substrate 201. Pixel TFTs 304 are disposed in a display region, and the driver circuits disposed peripherally are constructed on the basis of CMOS circuits. The scanning-signal driver circuit 404 and the image-signal driver circuit 405 are respectively connected to the pixel TFTs 304 by gate wiring 231 and source wiring 254. Besides, an FPC (Flexible Printed Circuit) 731 is connected to external input terminals 734, and it is connected to the respective driver circuits by input wirings 402, 403. IC chips for performing desired functions may be formed on the substrate 201.

EXAMPLE 3

In the present example, an example will be described in which the present invention is applied to manufacturing an electroluminescence (hereinafter referred to as EL) display device. The EL display device may also be called a light emitting device or a light emitting diode. Here, FIG. 22(A) is a plan view of an EL display device in accordance with the present invention and FIG. 22(B) is a cross-sectional view thereof.

Figure 22:
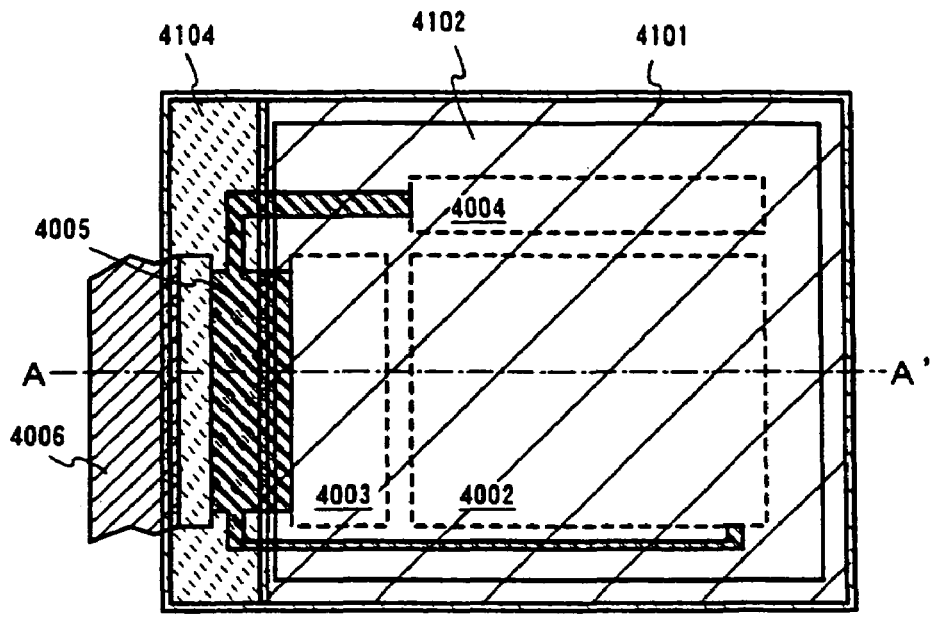
FIGS. 22(A) and 22(B) show an EL display panel utilizing the present invention.
Figure 22:
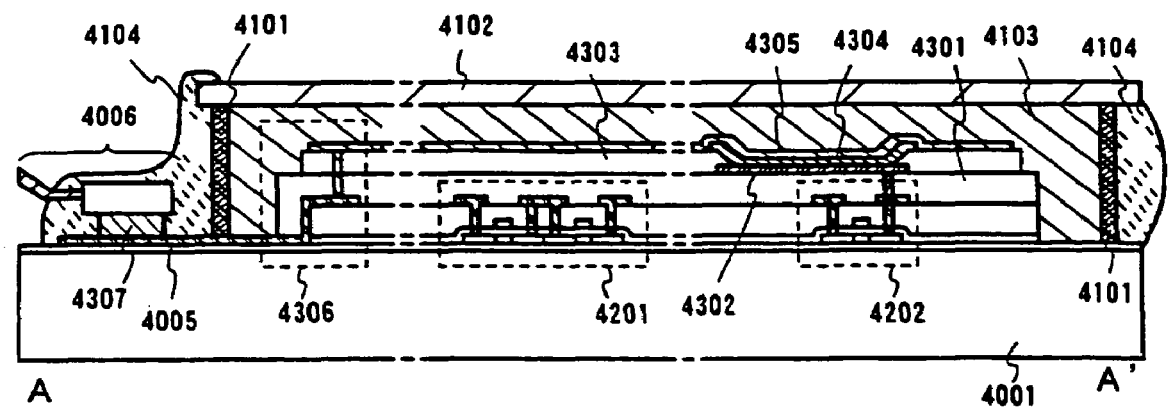

In FIG. 22(A), a reference character 4001 designates a substrate, 4002 designates a pixel section, 4003 designates a source side driving circuit, and 4004 designates agate side driving circuit, both the driving circuits being connected to an external unit by way of a wiring 4005 and a flexible printed circuit (referred top as FPC) 4006.

The EL display device is provided with a first sealing member 4101, a covering member 4102, a filler 4103, and a second sealing member 4104 such that they surround the pixel section 4002, the source side driving circuit 4003, and the gate side driving circuit 4004.

Also, FIG. 22(B) corresponds a cross-sectional view taken on a line A–A' in FIG. 22(A), in which a driving TFT 4201 included by the source side driving circuit 4003 (here are shown an n-channel type TFT and a p-channel type TFT) and a pixel TFT 4202 included by the pixel section 4002 (here is shown a TFT for controlling a current to the EL element) are formed on the substrate 4001.

In the present example, a TFT having the same structure as the driving circuit in FIG. 20 is used for the driving TFT 4201. Also, a TFT having the same structure as the pixel section in FIG. 20 is used for the pixel TFT 4202.

An interlayer insulating film (planarizing film) 4301 made of a resin material is formed on the driving TFT 4201 and the pixel TFT 4202, and a pixel electrode (anode electrode) 4302 electrically connected to the drain of the pixel TFT 4202 is formed thereon. A transparent conductive film having a large work function is used as the pixel electrode 4302. A compound of indium oxide and tin oxide or a compound of indium oxide and zinc oxide may be used as the transparent conductive electrode.

An insulating film 4303 is formed on the pixel electrode 4302 and has an opening above the pixel electrode 4302. An EL layer 4304 is formed in the opening on the pixel electrode 4302. The EL layer 4304 can be formed of a publicly known organic EL material or inorganic material. Also, either a low-molecular material (monomer base) or a high-molecular material (polymer base) may be used as the organic EL material. Also, the EL (electroluminessent) devices referred to in this specification may include triplet-based light emission devices and/or singlet-based light emission devices, for example.

A known technology may be used for forming the EL layer 4304. Also, the structure of the EL layer may be a laminated structure of a free combination of a hole-injected layer, a hole transport layer, a light emission layer, an electron transport layer, and an electron-injected layer, or a single layer structure of these layers.

A cathode electrode 4305 made of a conductive film having a light shielding property (typically a conductive film mainly composed of aluminum, copper, or silver, or a laminated film of this conductive film and the other conductive film) is formed on the EL layer 4304. Also, it is desired that moisture and oxygen existing in the interface between the cathode electrode 4305 and the EL layer 4304 are removed to a minimum. Therefore, it is necessary that both layers are continuously formed in a vacuum, or that the EL layer 4304 is formed in a nitrogen or rare gas atmosphere and then the cathode electrode 4305 is formed without exposing the EL layer 4304 to oxygen or moisture. In the present example, the use of a film forming apparatus of a multi-chamber type (cluster tool type) makes it possible to form the layers 4304, 4305 in the manner described above.

The cathode electrode 4305 is electrically connected to a wiring 4005 in the region designated by a reference number 4306. The wiring 4005 applies a predetermined voltage to the cathode electrode 4305 and is electrically connected to the FPC 4006 via a conductive material 4307.

An EL device composed of the pixel electrode (anode electrode) 4302, the EL layer 4304, and the cathode electrode 4305 is formed in this manner. The EL device is surrounded by the first sealing member 4101 and the covering member 4102 which is placed to the substrate 4001 with the sealing member 4101, and is sealed with the filler 4103.

A glass plate, a metal plate (typically stainless steel plate), a ceramic plate, a FRP (fiberglass-reinforced plastic) plate, a PVF (poly(vinyl fluoride)) film, a Mylar film, a polyester film, or an acrylic film may be used as the covering member 4102. Also, a sheet having a structure in which an aluminum foil is sandwiched between the PVF films or the Mylar films may be used as the covering member 4102.

The covering member 4102, however, needs to be transparent in the case where light emitted from the El device is radiated toward the covering member side. In this case, a transparent material such as a glass plate, a plastic plate, a polyester film, or an acrylic film is used.

Also, a ultraviolet curing resin or a thermosetting resin may be used as the filler 4103 and further a PVC (poly(vinyl chloride)) resin, an acrylic resin, a polyimide resin, an epoxy resin, a silicone resin, a PVB (poly(vinyl butyl)) resin, or an EVA (ethylene vinyl acetate) resin may be used as the filler 4103. If a moisture absorbing material (preferably, barium oxide) is contained by the filler 4103, it can prevent the deterioration of the EL device.

Further, it is recommended that a spacer be contained by the filler 4103. If the spacer is formed of a barium oxide, the spacer itself can have a moisture absorbing property. Also, when the spacer is contained by the filler 4103, it is effective that a resin film is formed on the cathode electrode 4305 as a buffer layer for reducing the pressure from the spacer.

Further, the wiring 4005 is electrically connected to the FPC 4006 via the conductive material 4307. The wiring 4005 transmits a signal to be sent to the pixel section 4002, the source side driving circuit 4003, and the gate side driving circuit 4004 to the FPC 4006 and is electrically connected to an external unit via the FPC 4006.

Still further, in the present example, the second sealing member 4104 is provided such that it covers the exposed portion of the first sealing member 4101 and the part of the FPC 4006, whereby the EL device is thoroughly shielded from the outside air. In this manner, the EL display device having a cross-sectional structure shown in FIG. 22(B) is manufactured.

EXAMPLE 4

An active matrix substrate and a liquid crystal display device (or an EL display device) fabricated by implementing the present invention can be used in various electronic devices. Namely, the present invention can be applied to all electronic apparatuses that incorporate such a device as a display medium. The following can be given as this type of electronic apparatuses: a personal computer, a digital camera, a video camera, a portable information terminal (such as a mobile computer, a cellular telephone, and an electronic book), and a navigation system. Some examples of those are shown in FIG. 23.

FIG. 23A shows a personal computer, which comprises: a main body 2001 comprising a microprocessor and a memory; an image input section 2002; a display device 2003; and a keyboard 2004. The present invention can be applied to the display device 2003 and other signal control circuits.

FIG. 23B shows a video camera, which comprises: a main body 2101; a display device 2102; a sound input section 2103; an operation switch 2104; a battery 2105; and an image receiving section 2106. The present invention can be applied to the display device 2102 and other signal control circuits.

FIG. 23C is a portable information terminal, which comprises: a main body 2201, an image input section 2202, an image receiving section 2203, operation switches 2204, and a display device 2205. The present invention can be applied to the display device 2205 and to other signal control circuits.

FIG. 23D is electronic game equipment such as a television game or a video game, and is composed of: a main body 2301 loaded with electronic circuits 2308 such as a CPU, and a recording medium 2304; a controller 2305; a display device 2303; and a display device 2302 built into the main body 2301. The display device 2303 and the display device 2302 incorporated into the main body 2301 may both display the same information, or the former may be taken as a main display and the latter may be taken as a sub-display to display information from the recording medium 2304 or the equipment operation status, or touch sensors can be added for use as an operating panel. Further, in order for the main body 2301, the controller 2305, and the display device 2303 to transmit signals to each other, wired communication may be used, or sensor portions 2306 and 2307 can be formed for either wireless communication or optical communication. The present invention can be ideally used for the display devices 2302 and 2303.

FIG. 23E is a player which uses a recording medium on which a program is recorded (hereinafter referred to as a recording medium), and is composed of a main body 2401, a display device 2402, a speaker portion 2403, a recording medium 2404, and operation switches 2405. Note that a DVD (Digital Versatile Disk), or Compact Disk (CD) is used as a recording medium for this device, and that information display can be performed for music appreciation, film appreciation, video games (or television games), and the Internet. The present invention can be ideally used for the display device 2402, and for other signal control circuits.

FIG. 23F is a digital camera, and is composed of a main body 2501, a display device 2502, a viewfinder portion 2503, operation switches 2504, and an image receiving portion (not shown in the figure) The present invention can be applied to the display devices 2502, and other signal control circuits.

Figure 24A:
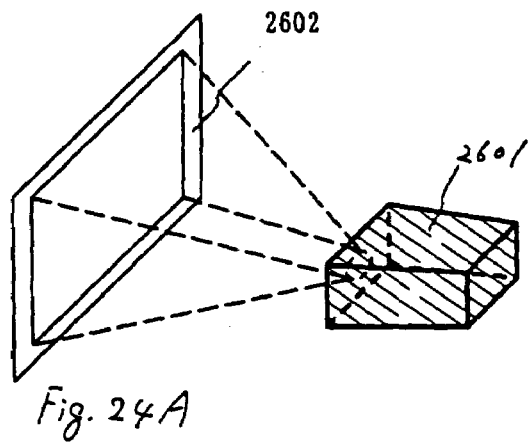
FIGS. 24A to 24D show a display device utilizing the present invention.
Figure 24B:
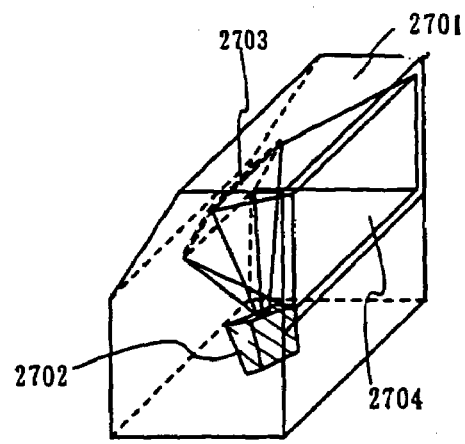

FIG. 24A is a front type projector, and is composed of an optical light source system and a display device 2601, and a screen 2602. The present invention can be applied to the display devices, and to other signal control circuits. FIG. 24B is a rear type projector, and is composed of a main body 2701, an optical light source system and a display device 2702, a mirror 2703, and a screen 2704. The present invention can be applied to display devices, and to other signal control circuits.

Figure 24C:
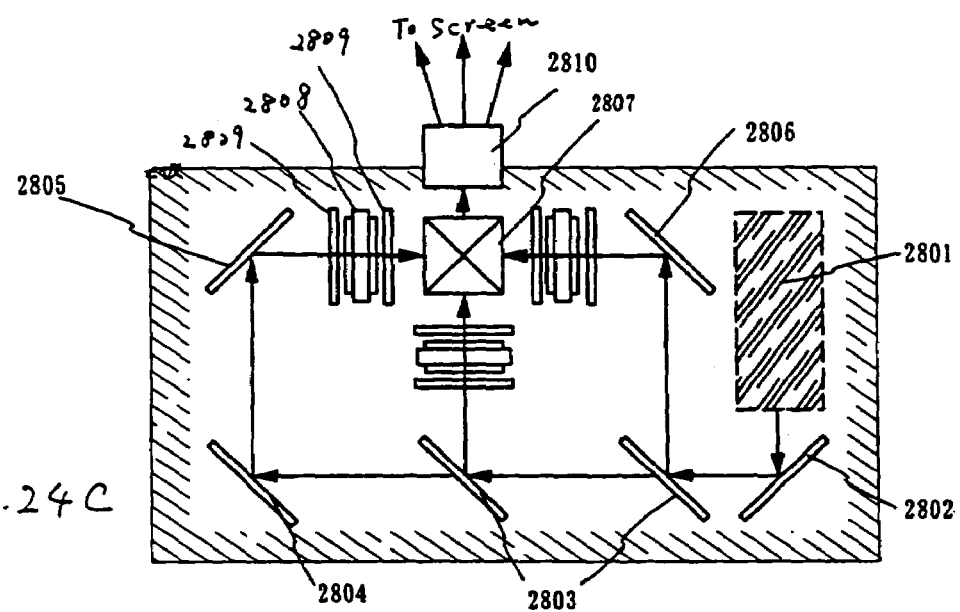
Figure 24D:
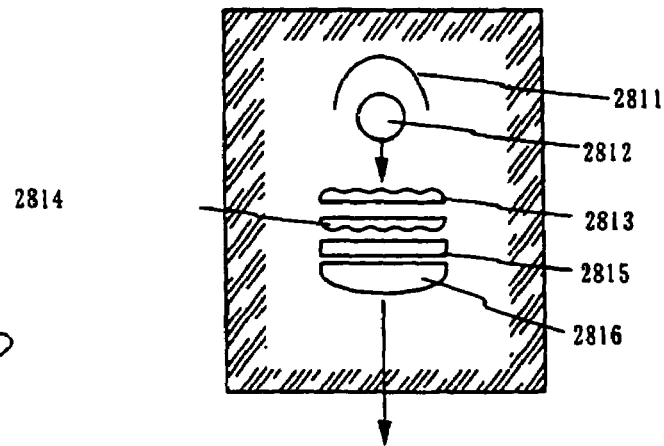

FIG. 24C is a drawing showing one example of the structure of the optical light source system and the display devices 2601 and 2702 in FIGS. 24A and 24B. The optical light source system and display devices 2601 and 2702 consist of an optical light source system 2801, mirrors 2802 and 2804 to 2806, a dichroic mirror 2803, a beam splitter 2807, a liquid crystal display device 2808, a phase difference plate 2809, and an optical projection system 2810. The optical projection system 2810 is composed of a plural number of optical lenses. In FIG. 24C an example is shown in which the liquid crystal display device 2808 is three plate type using three lenses, but there are no special limitations and a single plate type is acceptable. Further, the operator may suitably set optical systems such as optical lenses, polarizing film, film to regulate the phase, IR films, within the optical path shown by the arrows in FIG. 24C. In addition, FIG. 24D shows one example of the structure of the optical light source system 2801 of FIG. 24C. In embodiment 4, the optical light source system 2801 is composed of a reflector 2811, a light source 2812, lens arrays 2813 and 2814, a polarizing conversion element 2815, and a condenser lens 2816. Note that the optical light source system shown in FIG. 24D is one example, and there are no limitations placed on the structure shown in the figure.

Further, although not shown in the figures, it is possible to apply the present invention to a read-in circuit of a navigation system or an image sensor. Thus the application range for the present invention is extremely wide, and it can be applied to electronic apparatuses in all fields. Further, the electronic apparatuses of this embodiment can be realized with a composition that uses a combination of any of embodiments 1 to 4.

Also, though not shown here, the present invention can be applied to a navigation system, a reading circuit of an image sensor, or the like. In this manner, the present invention can be applied to an extremely wide range and to electronic apparatuses in many fields. In addition, the electronic apparatuses of the present example can be realized by the constitution composed of any combination of the examples 1 to 4.

According to the present invention, a TFT having a high mobility can be formed and a display device typified by an active matrix type liquid crystal display with high definition and an EL display.

What is claimed is:

1. A semiconductor device comprising:
   a substrate having an insulating surface;
   a heat absorbing layer formed over the substrate;
   an insulating film formed on the heat absorbing layer;
   an active layer on said insulating film and having a plurality of protrusions on a surface thereof; and
   a gate electrode formed over the active layer,
   wherein:
   said protrusions are arranged in parallel with a channel length direction, and
   a thermal conductivity of said heat absorbing layer is larger than those of said substrate and said insulating film.

2. A semiconductor device according to claim 1 wherein said active layer is formed by crystallizing a non-single crystalline semiconductor film by irradiating light thereto.

3. A semiconductor device according to claim 2 wherein said non-single crystalline semiconductor film is selected from an amorphous semiconductor layer, a microcrystalline semiconductor layer and a polycrystalline semiconductor layer.

4. A semiconductor device according to claim 1 wherein said active layer comprises silicon.

5. A semiconductor device according to claim 1 wherein said protrusions have a height of 30 nm or greater from the surface of the active layer.

6. A semiconductor device comprising:
   a substrate having an insulating surface;
   a heat absorbing layer formed over the substrate;
   an insulating film formed on the heat absorbing layer;
   an active layer formed on said insulating film and having a plurality of protrusions on a surface thereof; and
   a gate electrode formed over the active layer,
   wherein:
   said protrusions are arranged in parallel with a channel length direction of said active layer,
   said channel length direction is arranged in parallel with a side of the heat absorbing layer that is nearest to a channel forming region comprised in the active layer, and
   a thermal conductivity of said heat absorbing layer is larger than those of said substrate and said insulating film.

7. A semiconductor device according to claim 6 wherein said active layer is formed by irradiating a non-single crystalline semiconductor film with light.

8. A semiconductor device according to claim 7 wherein said non-single crystalline semiconductor film is selected from an amorphous semiconductor layer, a microcrystalline semiconductor layer and a polycrystalline semiconductor layer.

9. A semiconductor device according to claim 7 wherein said active layer comprises silicon.

10. A semiconductor device according to claim 7 wherein said protrusions have a height of 30 nm or greater from the surface of the active layer.

11. A semiconductor device according to claim 7 wherein said heat absorbing layer comprise a material selected from the group consisting of Cr, Mo, Ti, Ta and W.

12. A semiconductor device according to claim 6 wherein said heat absorbing layer functions as an electrode of a storage capacitor provided in a pixel of a liquid crystal display device or an EL display device.

13. A semiconductor device comprising:
   a substrate having an insulating surface;
   a heat absorbing layer formed over the substrate;
   an insulating film formed on the heat absorbing layer;
   an active layer on said insulating film and having a plurality of protrusions on a surface thereof; and
   a gate electrode formed over the active layer,
   wherein:
   said protrusions are arranged in a direction different from a channel width direction of said active layer, and
   a thermal conductivity of said heat absorbing layer is larger than those of said substrate and said insulating film.

14. A semiconductor device according to claim 13 wherein said active layer is formed by crystallizing a non-single crystalline semiconductor film by irradiating light thereto.

15. A semiconductor device according to claim 14 wherein said non-single crystalline semiconductor film is selected from an amorphous semiconductor layer, a microcrystalline semiconductor layer and a polycrystalline semiconductor layer.

16. A semiconductor device according to claim 13 wherein said active layer comprises silicon.

17. A semiconductor device according to claim 13 wherein said protrusions have a height of 30 nm or greater from the surface of the active layer.

18. A semiconductor device comprising:
   a substrate having an insulating surface;
   a heat absorbing layer formed over the substrate;
   an insulating film formed on the heat absorbing layer;
   an active layer formed on said insulating film and having a plurality of protrusions on a surface thereof; and
   a gate electrode formed over the active layer,
   wherein:
   said protrusions are arranged in a direction different from a channel width direction of said active layer,
   a channel width direction is arranged in the different direction from one side of the heat absorbing layer that is nearest to a channel forming region comprised in the active layer, and
   a thermal conductivity of said heat absorbing layer is larger than those of said substrate and said insulating film.

19. A semiconductor device according to claim 18 wherein said active layer is formed by irradiating a non-single crystalline semiconductor film with light.

20. A semiconductor device according to claim 19 wherein said non-single crystalline semiconductor film is selected from an amorphous semiconductor layer, a microcrystalline semiconductor layer and a polycrystalline semiconductor layer.

21. A semiconductor device according to claim 19 wherein said active layer comprises silicon.

22. A semiconductor device according to claim 19 wherein said protrusions have a height of 30 nm or greater from the surface of the active layer.

23. A semiconductor device according to claim 19 wherein said heat absorbing layer comprise a material selected from the group consisting of Cr, Mo, Ti, Ta and W.

24. A semiconductor device according to claim 18 wherein said heat absorbing layer functions as an electrode of a storage capacitor provided in a pixel of a liquid crystal display device or an EL display device.

25. A semiconductor device comprising:
a substrate having an insulating surface;
a heat absorbing layer formed over the substrate;
an insulating film formed on the heat absorbing layer;
an active layer on said insulating film and having a plurality of protrusions on a surface thereof; and
a gate electrode formed over the active layer,
wherein:
said protrusions are arranged in a direction deviated from a channel length direction of said active layer within a range of ±30°, and
a thermal conductivity of said heat absorbing layer is larger than those of said substrate and said insulating film.

26. A semiconductor device according to claim 25 wherein said protrusions are arranged in a direction deviated from a channel length direction of said active layer within a range of ±15°.

27. A semiconductor device according to claim 25 wherein said active layer is formed by crystallizing a non-single crystalline semiconductor film by irradiating light thereto.

28. A semiconductor device according to claim 27 wherein said non-single crystalline semiconductor film is selected from an amorphous semiconductor layer, a microcrystalline semiconductor layer and a polycrystalline semiconductor layer.

29. A semiconductor device according to claim 25 wherein said active layer comprises silicon.

30. A semiconductor device according to claim 25 wherein said protrusions have a height of 30 nm or greater from the surface of the active layer.

31. A semiconductor device comprising:
a substrate having an insulating surface;
a heat absorbing layer formed over the substrate;
an insulating film formed on the heat absorbing layer;
an active layer formed on said insulating film and having a plurality of protrusions on a surface thereof; and
a gate electrode formed over the active layer,
wherein:
said protrusions are arranged in a direction deviated from a channel length direction of said active layer within a range of ±30°,
a channel length direction is deviated within a range of ±30° from a side of the heat absorbing layer that is nearest to a channel forming region comprised in the active layer; and
a thermal conductivity of said heat absorbing layer is larger than those of said substrate and said insulating film.

32. A semiconductor device according to claim 31 wherein said protrusions are arranged in a direction deviated from a channel length direction of said active layer within a range of ±15°.

33. A semiconductor device according to claim 31 wherein said active layer is formed by irradiating a non-single crystalline semiconductor film with light.

34. A semiconductor device according to claim 33 wherein said non-single crystalline semiconductor film is selected from an amorphous semiconductor layer, a microcrystalline semiconductor layer and a polycrystalline semiconductor layer.

35. A semiconductor device according to claim 33 wherein said active layer comprises silicon.

36. A semiconductor device according to claim 33 wherein said protrusions have a height of 30 nm or greater from the surface of the active layer.

37. A semiconductor device according to claim 33 wherein said heat absorbing layer comprise a material selected from the group consisting of Cr, Mo, Ti, Ta and W.

38. A semiconductor device according to claim 31 wherein said heat absorbing layer functions as an electrode of a storage capacitor provided in a pixel of a liquid crystal display device or an EL display device.

* * * * *